US008501578B2

(12) United States Patent  
Gogoi

(10) Patent No.: US 8,501,578 B2  
(45) Date of Patent: Aug. 6, 2013

(54) SEMICONDUCTOR STRUCTURE FORMED WITHOUT REQUIRING THERMAL OXIDATION

(75) Inventor: Bishnu Prasanna Gogoi, Scottsdale, AZ (US)

(73) Assignee: Estivation Properties LLC, Dover, DE (US)

( * ) Notice: Subject to any disclaimer, the term of this patent is extended or adjusted under 35 U.S.C. 154(b) by 564 days.

(21) Appl. No.: 12/691,917

(22) Filed: Jan. 22, 2010

(65) Prior Publication Data

US 2011/0183490 A1 Jul. 28, 2011

(51) Int. Cl.  
*H01L 21/762* (2006.01)

(52) U.S. Cl.  
USPC ........... 438/424; 438/422; 438/429; 438/427; 257/E21.546

(58) Field of Classification Search  
USPC .......................... 438/424, 427; 257/E21.546  
See application file for complete search history.

(56) References Cited

U.S. PATENT DOCUMENTS

| 5,868,870 | A | * | 2/1999 | Fazan et al. | 148/33.3 |
|---|---|---|---|---|---|
| 7,368,365 | B2 | * | 5/2008 | Wells | 438/424 |
| 2002/0052092 | A1 | * | 5/2002 | Lachner | 438/424 |
| 2007/0020875 | A1 | * | 1/2007 | Hsu et al. | 438/424 |
| 2007/0059934 | A1 | * | 3/2007 | Park et al. | 438/689 |
| 2010/0144116 | A1 | * | 6/2010 | Hopper et al. | 438/427 |

FOREIGN PATENT DOCUMENTS

WO WO-2005/069378 7/2005

* cited by examiner

*Primary Examiner* — Angel Roman

(57) ABSTRACT

Briefly, in accordance with one or more embodiments, a semiconductor device is manufactured by forming at least two or more cavities below a surface of a semiconductor substrate wherein the at least two or more cavities are spaced apart from each other by a selected distance, filling at least a portion of the at least two or more cavities with a dielectric material to form at least two or more dielectric structures, removing a portion of the substrate between the at least two or more dielectric structures to form at least one additional cavity, and covering the at least one additional cavity.

21 Claims, 13 Drawing Sheets

SEMICONDUCTOR STRUCTURE FORMED WITHOUT REQUIRING THERMAL OXIDATION

TECHNICAL FIELD

Embodiments disclosed in the present disclosure relate generally to electrical and semiconductor technology, and more specifically to a semiconductor structure that includes a dielectric structure.

BACKGROUND

For some applications, such as higher frequency or radio frequency ("RF") applications, integrated passive devices may be formed using semiconductor processing technology or alternatively integrate passive devices such as inductors and/or capacitors may be formed together with active devices such as transistors using conductive silicon substrates such, as for example, a semiconductor die. However, passive devices may have relatively lower quality factors ("Qs") when these passive devices are formed on, or in relatively close proximity to, the conductive silicon substrate. In addition, due to parasitic capacitive coupling between these passive devices and the conductive silicon substrate, the frequency of operation of the integrated devices may be reduced. Electrically conductive interconnects or busses may be used to electrically couple different devices within the die and external to the die. The frequency of operation may also be adversely reduced by parasitic capacitive coupling between the interconnects and the conductive silicon substrate.

Further, regions of a semiconductor substrate may be physically and/or electrically isolated from each other. Additionally, some semiconductor devices, such as power transistors, provide a relatively high power output to be utilized in some RF, industrial, and medical applications as some examples. Power transistor designers are continually seeking ways to efficiently increase power output by varying the output voltage and current characteristics of a power transistor. For example, a power transistor may be designed to have an increased breakdown voltage to enable the power transistor to operate at a relatively higher voltage and provide a relatively higher power output.

Figure 1:
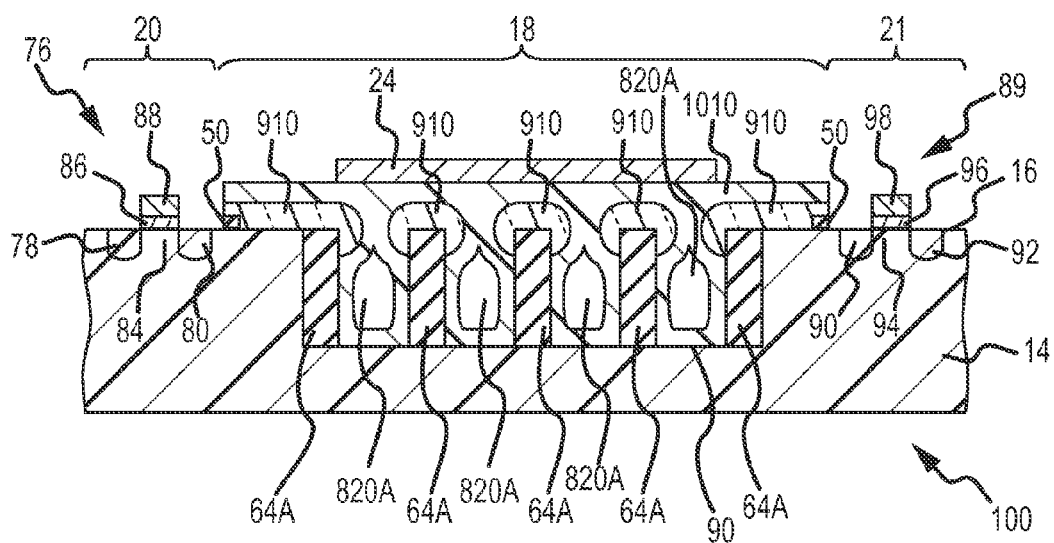
FIG. 1 is a cross-sectional view of a semiconductor structure in accordance with an embodiment of the present invention.

For simplicity of illustration and ease of understanding, elements in the various figures are not necessarily drawn to scale, unless explicitly so stated. Further, if considered appropriate, reference characters have been repeated among the figures to indicate corresponding and/or analogous elements. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention that the appended claims be limited by the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not be in contact with each other and may have another element or elements in between the two elements.

FIG. 1 is a cross-sectional view of a semiconductor structure 100 that illustrates a dielectric platform ("DP") 18, active regions 20 and 21, and an electrically conductive material 24 in accordance with an embodiment of the present invention. Dielectric platform 18 may be referred to as a dielectric structure or a dielectric region, and active regions 20 and 21 may also be referred to as active area regions, active areas, or portions of active areas since active devices, or portions of active devices, may be formed in active regions 20 and 21. In one or more embodiments, a dielectric platform, dielectric structure, and/or dielectric region may refer to a semiconductor structure or feature capable of providing reduced parasitic capacitances, relatively higher frequencies of operation, relatively higher breakdown voltages, relatively higher quality factor passive devices, and/or improved isolation between devices, or combinations thereof. In general, such a structure or region may be referred to a dielectric platform. It should be noted that a dielectric platform may implement one or more of the above mentioned characteristics, or alternatively may implement one or more other characteristics, for example structural integrity or stress reduction in a semiconductor device, however a dielectric structure is not required to implement any specific characteristics, and the scope of the claimed subject matter is not limited in this respect.

Dielectric platform 18 of semiconductor structure 100 comprises a plurality of sealed cavities 820A bounded by dielectric material formed in a substrate 14. In addition to sealed cavities 820A, dielectric platform 18 shown in FIG. 1 includes dielectric layer 50, capping material 910, sealing material 1010 and dielectric structures 64A. As will be discussed further below, at least a portion of dielectric platform 18 may be between electrically conductive material 24 and substrate 14 to reduce parasitic capacitance between electrically conductive material 24 and substrate 14. In other embodiments of the present invention, at least a portion of dielectric platform 18 is between at least a portion of electrically conductive material 24 and at least a portion of substrate 14 to reduce capacitance between electrically conductive material 24 and substrate 14.

Sealed cavity 820A may also be referred to as a sealed cavity, a sealed gap, a sealed void, a closed cell, or a closed cell void. In some embodiments, sealed cavity 820A may be evacuated to a pressure less than atmospheric pressure. In other words, the pressure in sealed cavity 820A may be below atmospheric pressure. As an example, the pressure in cavity 820A may range from approximately 0.1 Torr to approximately 10 Torr. The type of substance or material within sealed cavity 820A may include a variety or substances or materials, and the scope of the claimed subject matter is not limited in this respect. For example, sealed cavity 820A may contain a solid material or a fluid such as a liquid or a gas.

Active regions 20 and 21 are comprised of a portion of substrate 14. In some embodiments, substrate 14 may be referred to as a device layer or an active layer. Further, in some embodiments, substrate 14 may include one or more epitaxial layers or bonded layers. Substrate 14 may be used as an active area where active devices, such as, for example, transistors or diodes, or portions of active devices, may be subsequently formed. In some embodiments, semiconductor material 14 may be formed on a substrate comprised of the same or a different material. In one example, semiconductor material 14 is silicon which is epitaxially grown on a silicon substrate. It should be understood that a substrate may mean a semiconductor material, one or more epitaxial layers formed on a semiconductor material, a semiconductor material disposed on an insulating material, or the like, and the scope of the claimed subject matter is not limited in this respect. Accordingly, substrate 14 may also be referred to as a semiconductor substrate. Active devices may be formed in active regions 20 and 21 using conventional metal oxide semiconductor (MOS), complementary metal oxide semiconductor (CMOS), bipolar, or bipolar-CMOS (BiCMOS) processes, and so on. Substrate 14 may comprise a semiconductor material such as, for example, silicon, and may be doped or undoped depending on the application.

In one or more embodiments, all or substantially all of the dielectric portions of dielectric platform 18 may be formed without thermally formed oxidation. For example, in the case where substrate 14 comprises silicon, the present invention eliminates or greatly reduces the need for long oxidation steps at higher temperatures to create thick silicon oxide regions by thermal oxidation of silicon substrate 14. Thick thermal oxides may generate stress because of the approximately 2.2 times volume expansion that typically occurs when silicon is oxidized. Stress on the silicon lattice may lead to defects or dislocations in the silicon region which may result in undesirable excessive leakage currents in active devices formed in the active region adjacent to dielectric platform 18. In addition to stress caused by the expansion of silicon oxide when formed by thermal oxidation of silicon, the relatively longer times at higher temperature utilized to practicably form thick silicon oxide layers may be reduced or eliminated in one or more embodiments. Such an arrangement reduces additional stress that may be generated during heating and cooling of the dielectric structure and the silicon region due to the coefficient of thermal expansion ("CTE") mismatch between silicon and oxide. In another embodiment, substrate 14 may comprise a material, for example germanium (Ge), gallium arsenide (GaAs), indium phosphide (InP) and the like, that does not form a suitably stable oxide. Other methods of forming a dielectric platform that require thick thermal oxides may not be suitable for such substrates, whereas the present invention may be used to practicably form a DP in such substrates.

In some embodiments, the depth or thickness of dielectric platform 18 may range from about 1 μm to about 40 μm. In some embodiments, lower surface 90 of dielectric platform 18 is parallel to, or substantially parallel to, top surface 16 of substrate 14, however the scope of the claimed subject matter is not limited in this respect, and in other embodiments lower surface 90 of dielectric platform 18 may not be parallel to surface 16 and/or may not all be at one level. In some embodiments, lower surface 90 of dielectric platform 18 is at a distance of at least about one μm or greater below top surface 16 and the width of dielectric platform 18 is at least about three μm or greater. In other embodiments, lower surface 90 of dielectric platform 18 is at a distance of at least about 3 μm or greater below top surface 16 and the width of dielectric platform 18 is at least about 5 μm or greater. In one example, the thickness of dielectric platform 18 may be about ten μm and the width of dielectric platform 18 may be about 10 μm. In yet other embodiments, the thickness of dielectric platform 18 may be equal to, or approximately equal to, the thickness of substrate 14, for example, the thickness of the semiconductor die and the width of dielectric platform 18 may be up to about 1000 μm. The thickness and width of dielectric platform 18 may be varied depending on the application for dielectric platform 18 and the desired die size of the resulting semiconductor device that uses substrate 14. For example, a relatively thicker dielectric platform may be desired in applications where dielectric platform 18 is used to form high Q passive devices compared to an application where dielectric platform 18 is used for isolation.

In some embodiments, the height of dielectric structures 64A is equal to, or approximately equal to, the depth of cavities 820 (FIG. 9), however the scope of the claimed subject matter is not limited in this respect. In other embodiments, the height of dielectric structures 64A may be greater than, or less than, the depth of cavity 820.

The combination of sealing material 1010, capping material 910, dielectric layer 50, dielectric structures 64A and sealed cavities 820A reduces the overall permittivity of dielectric platform 18 so that dielectric platform 18 has a relatively low dielectric constant. In other words, the combination of sealing material 1010, capping material 910, dielectric layer 50, dielectric structures 64A and sealed cavities 820A results in dielectric platform 18 having a lower or reduced dielectric constant. Silicon dioxide has a dielectric constant of about 3.9. Accordingly, a solid or filled dielectric structure that includes no cavities and includes silicon dioxide may have a dielectric constant of about 3.9. Since empty space has the lowest dielectric constant (the dielectric constant of empty space is 1), the more empty space or void space incorporated into the dielectric platform, the lower the overall dielectric constant. Accordingly to minimize the dielectric constant of dielectric platform 18, the depth of dielectric platform 18 may be increased, the volume of sealed cavities 820A may be increased, the volume of dielectric material in dielectric structures 64A may be reduced, and/or the amount of dielectric capping material 910, dielectric layer 50 and/or sealing material 1010 contained in dielectric platform 18 may be reduced.

In some embodiments described herein, dielectric platform 18 includes one or more cavities occupying in excess of about 40% of the total volume of dielectric platform 18. This may result in an effective dielectric constant reduction of about 30% or greater, from a dielectric constant of about 3.9 to an effective dielectric constant of about 2.74. In one embodiment, dielectric platform 18 includes one or more cavities occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 18 may result in dielectric platform 18 having a dielectric constant of about 1.5 or less. As a result, passive elements formed over dielectric platform 18 have reduced parasitic capacitances to substrate 14. The parasitic substrate capacitance is reduced by both the reduced effective dielectric constant of dielectric platform 18 and the increased thickness of dielectric platform 18.

In addition, dielectric platform 18 may be used to increase the frequency of operation of any devices formed using semiconductor structure 100. For example, passive components such as, for example, inductors, capacitors, or electrical interconnects, may be formed over embedded dielectric platform 18 and may have reduced parasitic capacitive coupling between these passive components and substrate 14 since embedded dielectric platform 18 has a relatively low dielectric constant or permittivity and since embedded dielectric platform 18 increases the distance between the passive components and the conductive substrate. Reducing parasitic substrate capacitances may increase the frequency of operation of any devices formed using a dielectric platform. As an example, the passive component may comprise electrically conductive material 24, wherein electrically conductive material 24 may comprise, for example, aluminum, copper, or doped polycrystalline silicon. In various examples, the passive component may be an inductor, a capacitor, a resistor, an electrical interconnect, or a combination thereof and may be coupled to one or more active devices formed in active regions 20 and 21.

Since at least a portion of dielectric platform 18 is formed in and/or below the surface of the substrate, dielectric platform 18 may be referred to as an embedded dielectric structure. Embedded may mean that at least a portion of dielectric platform 18 is below a plane (not shown) that is coplanar to, or substantially coplanar to, top surface 16 of substrate 14. In some embodiments, the portion of dielectric layer 18 below the plane extends from the plane to a depth of at least about three μm or greater below the plane and the portion of dielectric platform 18 below the plane has a width of at least about five μm or greater. In other words, at least a portion of dielectric platform 18 is embedded in substrate 14 and extends a distance of at least about 3 μm or greater from top surface 16 toward the bottom surface of substrate 14 and the portion of dielectric platform 18 embedded in substrate 14 has a width of at least about 5 μm or greater in some embodiments.

Further, dielectric platform 18 may be used to form relatively higher quality factor passive devices such as, for example, capacitors and/or inductors having a relatively higher Q since dielectric platform 18 may be used to isolate and/or separate the passive devices from the substrate. Active devices, such as transistors or diodes, may be formed in regions adjacent to, or abutting, dielectric platform 18, and these active devices may be coupled to passive components such as spiral inductors, interconnects, microstrip transmission lines and the like that are formed on a planar top or upper surface of dielectric platform 18. Increasing the distance between the passive components and substrate 14 allows higher Qs to be realized for these passive components.

As an example, a field effect transistor (FET) 76 may be formed in active region 20 and FET 89 may be formed in active region 21. FET 76 may be a MOSFET and may include a source region 78 in a portion of substrate 14, a drain region 80 in a portion of substrate 14, a gate oxide 86 over a portion of substrate 14, a gate 88 over gate oxide 86, and a channel region 84 formed in a portion of substrate 14 under gate oxide 86 and between source and drain regions 78 and 80, respectively. FET 89 may be a MOSFET and may include a source region 92 in a portion of substrate 14, a drain region 90 in a portion of substrate 14, a gate oxide 96 over a portion of substrate 14, a gate 98 over gate oxide 96, and a channel region 94 formed in a portion of substrate 14 under gate oxide 96 and between source and drain regions 92 and 90, respectively.

As discussed above, substrate 14 may comprise a semiconductor material such as, for example, silicon. Substrate 14 may serve as part of a drain region of a vertical transistor formed in active region 21. In this example, a source contact or electrode (not shown) may be formed on or adjacent to an upper surface of substrate 14 and a drain electrode (not shown) may be formed on or adjacent to a lower surface of substrate 14. During operation, the electrical current flow from the source electrode to the drain electrode in the vertical transistor may be substantially perpendicular to the upper and lower surfaces of semiconductor structure 100. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in United States ("US") patent application having application Ser. No. 10/557,135, titled "POWER SEMICONDUCTOR DEVICE AND METHOD THEREFOR," filed Nov. 17, 2005, which claims priority to Patent Cooperation Treaty ("PCT") International Application Number PCT/US2005/000205 titled "POWER SEMICONDUCTOR DEVICE AND METHOD THEREFOR," having an International Filing Date of Jan. 6, 2005, and an International Publication Date of Jul. 28, 2005, the contents of both of these patent applications are incorporated herein by reference in their entireties.

Power transistors having relatively higher breakdown voltages, and consequently relatively higher power output, may be realized by forming a vertical transistor in an active area adjacent to dielectric platform 18, as dielectric platform 18 may provide edge termination for the equipotential lines from an electric field in an active area that is adjacent to dielectric platform 18. Higher breakdown voltages may be achieved as the edge termination provided by dielectric platform 18 may reduce curvature of the equipotential lines. As is generally understood, curvature of the equipotential lines results in lower breakdown voltages. To maximize breakdown voltage, the equipotential lines are parallel, or substantially parallel, to top surface 16 of substrate 14, and these equipotential lines are planar with little to no curvature.

If devices are designed to have relatively high breakdown voltages, then the lateral sidewall of dielectric platform 18 that contacts the active region is formed to be a dielectric material that is perpendicular, or substantially perpendicular, relative to top surface 16 of substrate 14, for example as shown in FIG. 1, to allow the equipotential lines to terminate substantially perpendicular at the lateral sidewall of dielectric platform 18. Dielectric platform 18 may be adjacent to, abutting, and/or surrounding, active regions 20 and 21 to provide edge termination for terminating equipotential lines in active regions 20 and 21, which may result in relatively higher breakdown voltages for active devices formed in the active regions.

In addition, if dielectric platform 18 surrounds one or more active regions, then dielectric platform 18 may also be used to provide electrical isolation. For example, dielectric platform 18 may be used to electrically isolate active regions from each other, which may also result in electrical isolation between any active devices formed in the isolated active regions.

Although only a single active device is discussed as being formed in active regions 20 and 21, the methods and apparatuses described herein are not limited in this regard. In some embodiments, a plurality of active devices may be formed in active regions 20 and 21. Further, the types of active devices are not limited to being FETS. Other types of devices that may be formed in active regions 20 and 21 include bipolar junction transistors, junction field effect transistors, insulated gate bipolar junction transistors, diodes, thyristors, passive devices, or the like, and the scope of the claimed subject matter is not limited in these respects.

Figure 2:
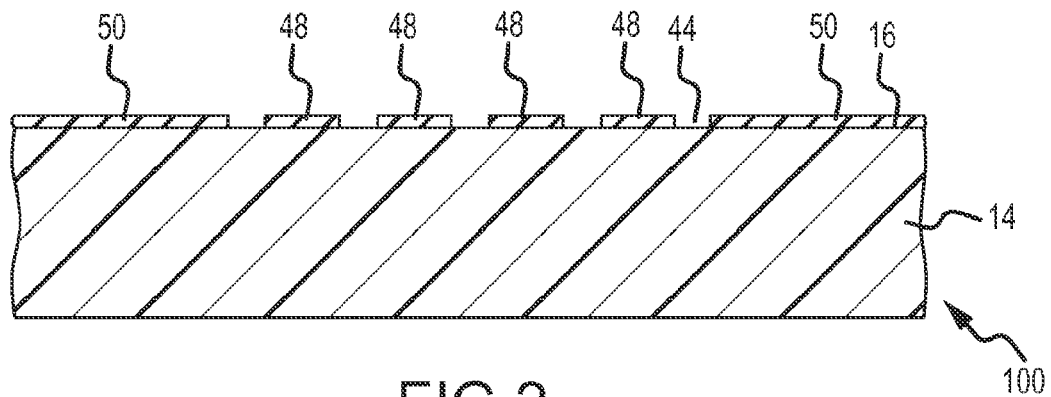
FIG. 2 is a cross-sectional view of the semiconductor structure of FIG. 1 at an earlier stage of manufacture.

FIG. 2 is a cross-sectional view of a semiconductor structure at a beginning stage of manufacture, in accordance with an embodiment. What is shown in FIG. 2 is substrate 14, which may be used as a substrate for the fabrication of semiconductor structure 100 of FIG. 1, semiconductor structure 200 of FIG. 11, and/or semiconductor structure 300 of FIG. 19, which represent different embodiments as discussed herein. Substrate 14 may comprise a semiconductor material such as, for example, silicon, and may be doped or undoped depending on the application, although the claimed subject matter is not limited in this regard. Substrate 14 may have a thickness ranging from about 100 µm to about 1,000 µm.

However, the thickness of substrate 14 may be reduced through subsequent thinning processes in some embodiments.

A layer of dielectric material 50 may be formed over substrate 14. Layer 50 may comprise, for example, silicon dioxide ("$SiO_2$") and may have a thickness ranging from about 100 Å to about 5,000 Å. Silicon dioxide layer 50 may be formed using deposition techniques or thermal growth techniques such as, for example, thermal oxidation of silicon.

After the oxidation process is performed, silicon dioxide layer 50 and substrate material 14 may be patterned using photolithography and etching processes. Photolithography processes or operations involve the use of masks and may sometimes be referred to as masking operations or acts. The photolithography and etching may include forming a layer of a radiation-sensitive material, such as photoresist (not shown), over the semiconductor structure, then exposing the photoresist using, for example, ultraviolet ("UV") radiation to form a mask, and then etching portions of silicon dioxide layer 50 using an isotropic or anisotropic etch process such as, for example, wet chemical etching or a reactive ion etch ("RIE"), respectively, to form one or more opening 44. Masked area 48 formed using dielectric layer 50 may also formed in this process.

Figure 3:
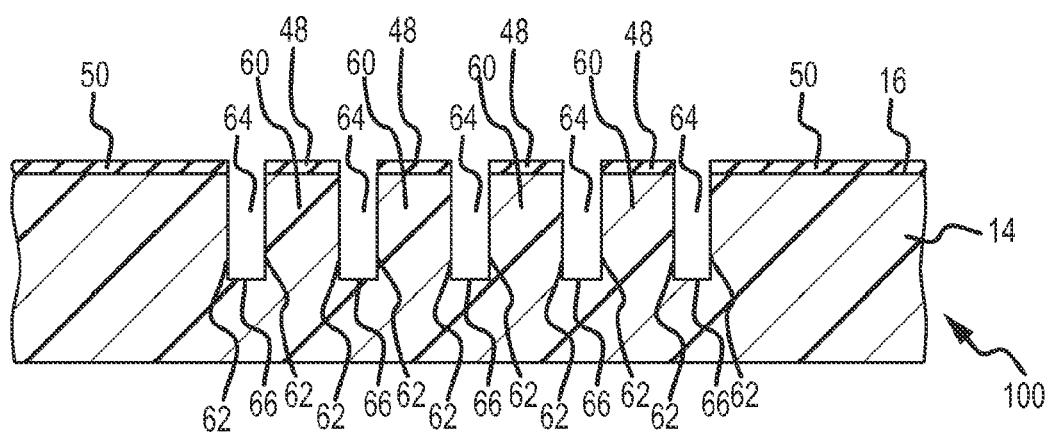
FIG. 3 is a cross-sectional view of the semiconductor structure of FIG. 2 at a later stage of manufacture, and a cross-sectional view of the semiconductor structure of FIG. 4 taken along section line 3-3 of FIG. 4

Silicon dioxide layer 50 may serve as a hard mask, and may be referred to as a masking layer. Since the photoresist over silicon dioxide layer 50 is also etched as part of the silicon etch used to etch portions of substrate 14, dielectric layer 50 may be used as a hard mask to prevent the undesired etching of the upper surface of substrate 14 during the formation of cavity 64 (FIG. 3). Layer 50 is optional, as in alternate embodiments, the subsequent photoresist layer may be made relatively thick such that it is not completely eroded during the etching process of cavity 64 as shown in FIG. 3, and therefore, the photoresist may be used as a masking layer rather than using layer 50.

In some embodiments the width of opening 44 may be in the range of about 1 µm to about 5 µm and the width of mask area 48 may be in the range of about 1 µm to about 15 µm. The width of opening 44 may determine the width of subsequently formed cavity 64 as shown in FIG. 3, as well as the spacing between cavities 64 as shown in FIG. 3. The dielectric constant of the DP is determined at least in part by the relative amounts of void space and dielectric and since void space has a dielectric constant lower than that of dielectric, the overall dielectric constant of the dielectric platform may reduced by maximizing, or nearly maximizing, the volume of void space and/or by minimizing, or nearly minimizing, the volume of dielectric within the dielectric platform. In one embodiment this may be achieved by minimizing the width of opening 44 and thus cavity 64 of FIG. 3, and by maximizing the width of masked area 48. As will be discussed in further detail, below, one limitation to maximization of masked area 48 may be the processing ability to cap the final structure, however the scope of the claimed subject matter is not limited in this respect.

Figure 4:
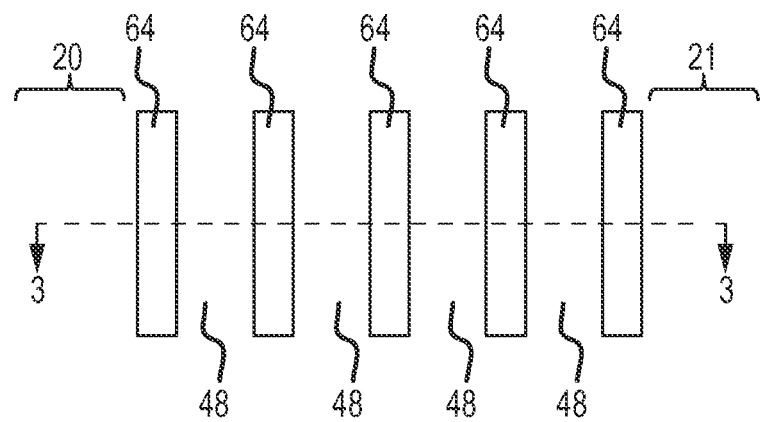
FIG. 4 is a top view of the semiconductor structure of FIG. 3.

FIG. 3 is a cross-sectional view of the structure of FIG. 2 at a later stage of manufacture. FIG. 4 is a top view of the structure of FIG. 3 in accordance with an embodiment of the present invention, and FIG. 3 is a cross-sectional view taken along section line 3-3 of FIG. 4. With reference to FIGS. 3 and 4, after formation of openings 44 of FIG. 2 a portion of the exposed portions of substrate 14 are removed by, for example, etching, to form one or more cavity 64 having sidewalls 62. Cavity 64 may also be referred to as an open cavity, an opening, a void, a gap, an empty region, an empty space, a trench or the like.

The etch process for formation of cavity 64 is preferably anisotropic but in some embodiments may be isotropic. In one embodiment cavity 64 may be formed using an anisotropic etch, for example RIE. In some embodiments, cavity 64 may be formed using at least one etch operation to remove portions of silicon dioxide 50 and substrate 14. In other embodiments, two etching operations may be used to form cavity 64. For example, one etch operation may be used to remove portions of silicon dioxide layer 50 while a second etch operation may be used to remove portions of substrate 14.

In other words, the etch forms cavity 64 having a floor 66 from which structures 60 extend. Structures 60 extend from floor 66 to top surface 16. Turning now to FIG. 4, cavity 64 may be in the form of a straight trench and the extent of trench 64 may determine the size and shape of dielectric platform 18 of FIG. 1. Although cavity 64 is described and shown as a trench herein, the claimed subject matter is not limited in this regard, and cavity 64 may have other shapes. In some embodiments trench 64 may have a length in the range of about 2 μm to about 1000 μm, however the scope of the claimed subject matter is not limited in this respect, and in other embodiments trench 64 may be either shorter or longer.

Figure 5:
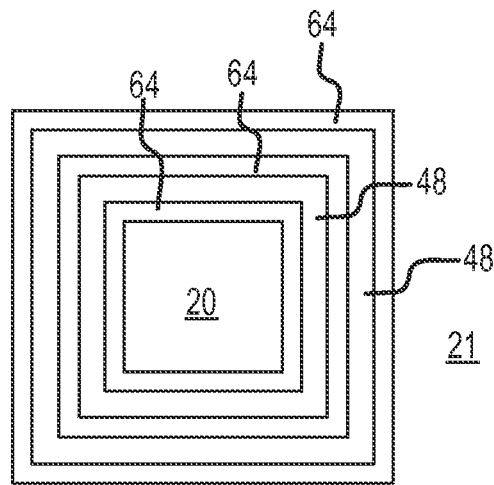
FIG. 5 is a top view of a semiconductor structure in accordance with another embodiment of the present invention.

In another embodiment cavity 64 may be in the form of closed trenches, as shown in FIG. 5. FIG. 5 shows a top view of a semiconductor structure similar to that shown in FIG. 4, but with closed trenches. In other words, cavity 64 may be formed surrounding a portion of substrate 14. In this way the dielectric platform may isolate a portion of substrate 14 from another portion of substrate 14 using dielectric platform 18. As shown in FIG. 4, the end of trench 64 terminates in substrate 14. In contrast, in FIG. 5, trench 64 forms a loop enclosing a portion of substrate 14. This embodiment may be used to form a dielectric platform that isolates active region 20 from active region 21 Although cavity 64 in FIG. 4 and FIG. 5 are shown with a rectangular cross section, the scope of the claimed subject matter is not limited in this respect, and in other embodiments cavity 64 may have other shapes including a polygonal shape, a circular shape, or any arbitrary shape.

In some embodiments, the etch chemistry may be selected so that sidewalls 62 form an angle that is perpendicular, or substantially perpendicular to top surface 16. However, the scope of the claimed subject matter is not limited in this respect, and in other embodiments, sidewalls 62 may be non-perpendicular to surface 16. Since cavity 64 will be filled with dielectric in the final structure of FIG. 1, in one embodiment the dielectric constant of dielectric platform 18 may be reduced if sidewalls 62 form an angle with surface 16 that is less than 90°. However, this may reduce the width of the top opening of cavity 64, making it more difficult to fill in a subsequent processing step. In the example shown in FIG. 3, sidewalls 62 are shown as substantially perpendicular to surface 16.

The depth of cavity 64 may be in the range of about 1 μm to about 40 μm. In one or more embodiments, the depth of cavity 64 may be greater than the width of cavity 64. Thus, in some embodiments the depth of cavity 64 may be at least two times ("2×") greater than the width of cavity 64. Alternatively, the depth of cavity 64 may be at least about ten times ("10×") greater than the width of cavity 64. For example, if the width of cavity 64 is about 1 μm, the depth of cavity 64 may be about 10 μm or more.

Figure 6:
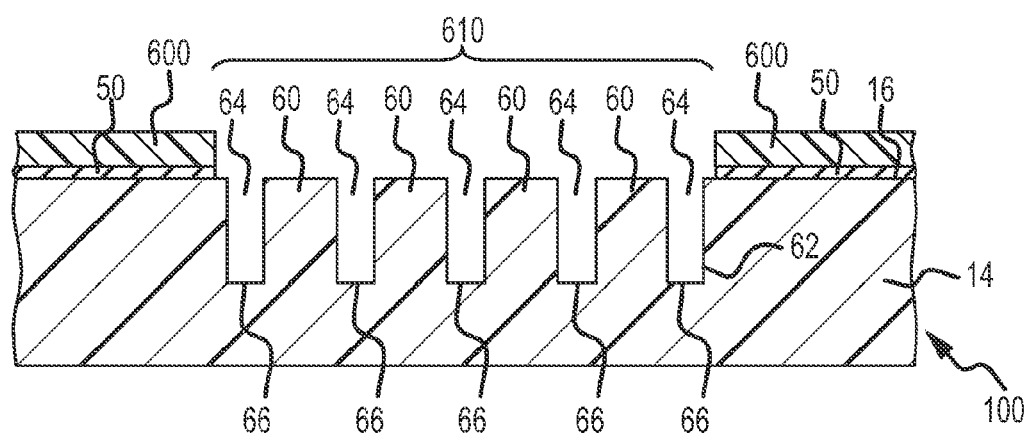
FIG. 6 is a cross-sectional view of the semiconductor structure of FIG. 3 at a later stage of manufacture.

FIG. 6 is a cross-sectional view of the semiconductor structure of FIG. 3 at a later stage of manufacture. After formation of cavity 64, a layer of photoresist 600 may be dispensed over silicon dioxide layer 50 and cavity 64 and patterned to form opening 610. The exposed portions of silicon dioxide 50, including mask region 48 (FIG. 1) may then be removed to expose the surface portions of substrate 14. Silicon dioxide layer 50 may be removed for example by using an isotropic or anisotropic etch process such as, for example, wet chemical etching or a reactive ion etch (RIE). After removal of the exposed portions of silicon dioxide layer 50, photoresist 600 may be stripped or removed.

Figure 7:
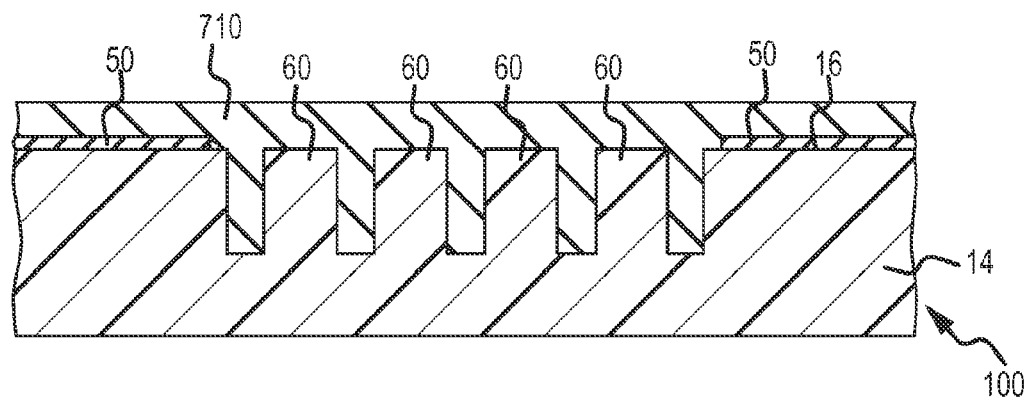
FIG. 7 is a cross-sectional view of the semiconductor structure of FIG. 6 at a later stage of manufacture.

FIG. 7 is a cross-sectional view of the semiconductor structure of FIG. 6 at a later stage of manufacture. After removal of photoresist 600, cavity 64 of FIG. 6 may be filled with a dielectric material 710. In some embodiments dielectric material 710 may be formed in a conformal process. For example dielectric material 710 may comprise an oxide or a nitride. In other embodiments dielectric material 710 may comprise phosphorus silicate glass (PSG), boron silicate glass (BSG), or boron phosphorus silicate glass (BPSG). Suitable techniques for forming dielectric material 710 include Chemical Vapor Deposition (CVD), plasma Enhanced CVD (PECVD), low pressure CVD (LPCVD), spin-on processing, sputtering, evaporation, or the like. In one example dielectric material 710 may comprise silicon oxide and may be formed using low pressure chemical vapor deposition (LPCVD), for example using a hot wall tetraethylorthosilicon (TEOS) process.

In some embodiments dielectric material 710 may completely fill cavity 64 of FIG. 6, and in other embodiments dielectric material 710 may partially fill cavity 64 of FIG. 6. The dielectric constant of the dielectric platform may be determined at least in part by the relative amounts of void space and dielectric and since void space has a dielectric constant lower than that of dielectric, the overall dielectric constant of the dielectric platform may be relatively reduced by, for example lining cavity 64 of FIG. 6 with dielectric material 710 instead of filling cavity 64 of FIG. 6 with dielectric material 710.

In contrast to other processes used to form a dielectric platform, in one or more embodiments dielectric material 710 is deposited and is not formed by the partial oxidation or nitridation of substrate 14, or using any other process that consumes a portion of substrate 14. Oxidation or nitridation of substrate 14 otherwise creates higher stress in the semiconductor and may lead to the generation of defects that can adversely affect device performance. In accordance with one or more embodiments, dielectric material 710 may be deposited, resulting in relatively lower stress and thus may reduce or eliminate the generation of defects.

Figure 8:
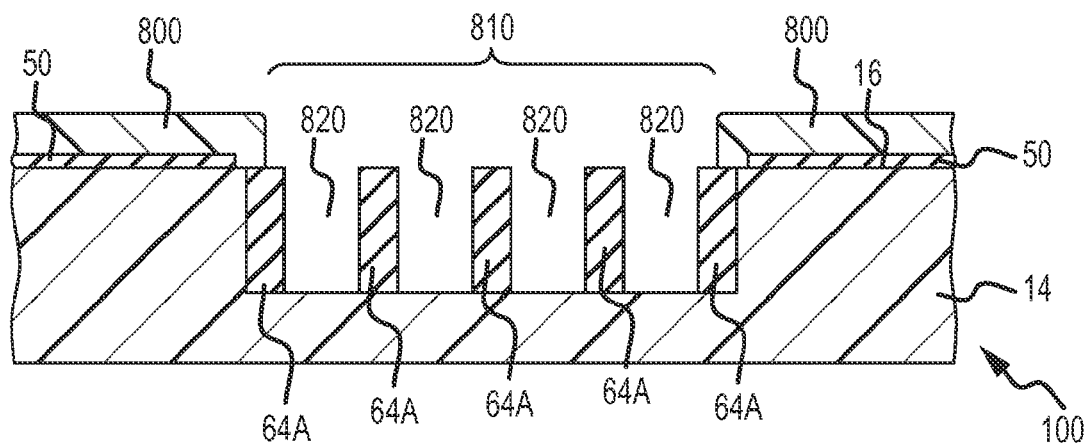
FIG. 8 is a cross-sectional view of the semiconductor structure of FIG. 7 at a later stage of manufacture.

After formation of dielectric material 710, the portions of dielectric material 710 above a plane parallel to surface 16 of substrate 14 may be removed, for example by etching or by chemical mechanical polishing (CMP), forming oxide structures 64A of FIG. 8. In the example where dielectric material 710 is silicon oxide, silicon oxide 710 may be removed using a blanket or an anisotropic etch, for example RIE. The process to remove portions of silicon oxide 710 above a plane parallel to surface 16 of substrate 14 may also optionally remove silicon oxide layer 50. In the example shown in FIG. 7, silicon oxide layer 50 is not removed. In the example shown in FIG. 7 and FIG. 8, dielectric material 710 is removed such that the top of oxide structures 64A is level with surface 16 of substrate 14, however the scope of the claimed subject matter is not limited in this respect, and in other embodiments the top of oxide structures 64A may be at a height above or below surface 16 of substrate 14

FIG. 8 is a cross-sectional view of the semiconductor structure of FIG. 7 at a later stage of manufacture. After removal of portions of silicon oxide 710 of FIG. 7 above a plane parallel to surface 16 of substrate 14, the remaining silicon oxide 710 of FIG. 7 may form oxide structures 64A. After formation of oxide structures 64A, a layer of photoresist 800 may be dispensed over dielectric layer 50, oxide structures 64A and the exposed surface 16 of substrate 14 and patterned to form opening 810. Portions of the exposed portions of substrate 14 may then be removed to form cavities 820. The exposed portions of substrate 14 may be removed, removed for example by using an isotropic or anisotropic etch process such as, for example, wet chemical etching or a reactive ion etch ("RIE"). In some embodiments, the etchant has a high selectivity between silicon and silicon oxide. In other words the etch rate for silicon may be relatively higher than for oxide. In one embodiment the etch rate of silicon may be at least 10 times greater than the etch rate of oxide. In another embodiment the etch rate of silicon may be at least 50 times greater than the etch rate of oxide. After formation of oxide structure 64A, photoresist 800 may be stripped or removed. In the example shown in FIG. 8, the bottom of cavity 820 is shown as being as the same level as the bottom of oxide structure 64A, however the scope of the claimed subject matter is not limited in this respect, and in other embodiments the bottom of cavity 820 may be either above or below the bottom of oxide structure 64A.

Figure 9:
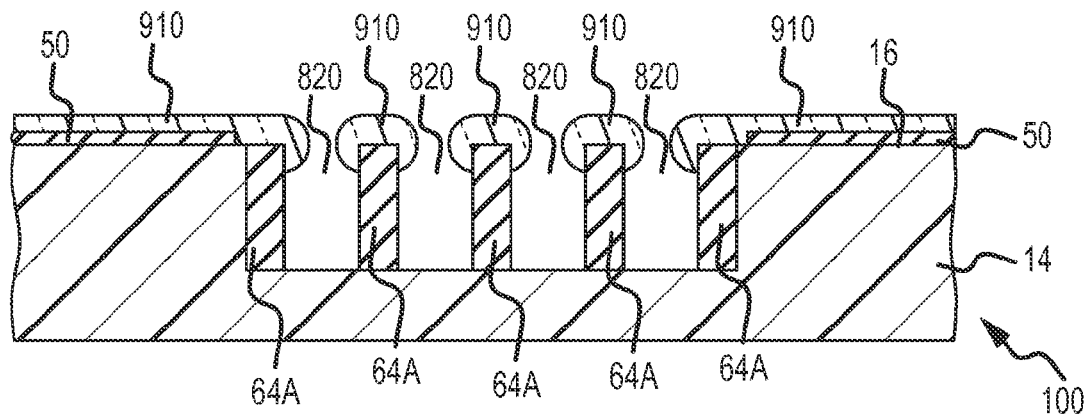
FIG. 9 is a cross-sectional view of the semiconductor structure of FIG. 8 at a later stage of manufacture.

FIG. 9 is a cross-sectional view of the semiconductor structure of FIG. 8 at a later stage of manufacture. After removal of photoresist 800, a capping material 910 may be formed over dielectric layer 50, portions of substrate 14 and over the top surface and optionally over portions of sidewalls of oxide structure 64A. Capping material 910 may be deposited, grown, spun-on, or the like. By way of example, capping material 910 may be a dielectric material that may be non-conformally deposited using, for example, evaporation or sputtering. In some embodiments capping material 910 may be deposited using a vapor deposition process, for example CVD, LPCVD or PECVD. Suitable dielectric materials for capping material 910 include silicon oxide, nitride, or the like.

Subsequent sealing of cavities 820 may be facilitated by the formation of capping material 910 which reduces the width or lateral dimension of the top of cavities 820. In other words, by forming capping material 910 over oxide structures 64A, the distance between capping material 910 over oxide structures 64A may be substantially smaller, or less than, the distance between the lower portions of oxide structures 64A. This may facilitate sealing and reduce the overall dielectric constant of the resulting dielectric platform. Thus in one embodiment, capping material 910 may be formed such that the subsequent spacing between capping material 910 over oxide structures 64A may be minimized, or nearly minimized. The amount of capping material 910 that is deposited depends at least in part on the spacing between oxide structures 64A, the lateral and vertical deposition rate of capping material 910, the desired dielectric constant of the dielectric platform, and/or the ability of the subsequently formed sealing layer 1010 of FIG. 10 to bridge the gaps between capping material 910 over oxide structures 64A. In some embodiments, the thickness of capping material 910 may range from about 0.5 μm to about 8 μm, however the scope of the claimed subject matter is not limited in this respect, and in other embodiments capping layer may be either thicker or thinner. In some embodiments the distance between the capping materials 910 on oxide structures 64A may be about 2 μm or less. In one example oxide structure 64A may be about 2 μm wide, cavity 820 may be about 5 μm and capping material 910 may extend about 2 μm past the edge of oxide structure 64A, leaving a gap between capping materials 910 over oxide structure 64A of about 1 μm.

Figure 10:
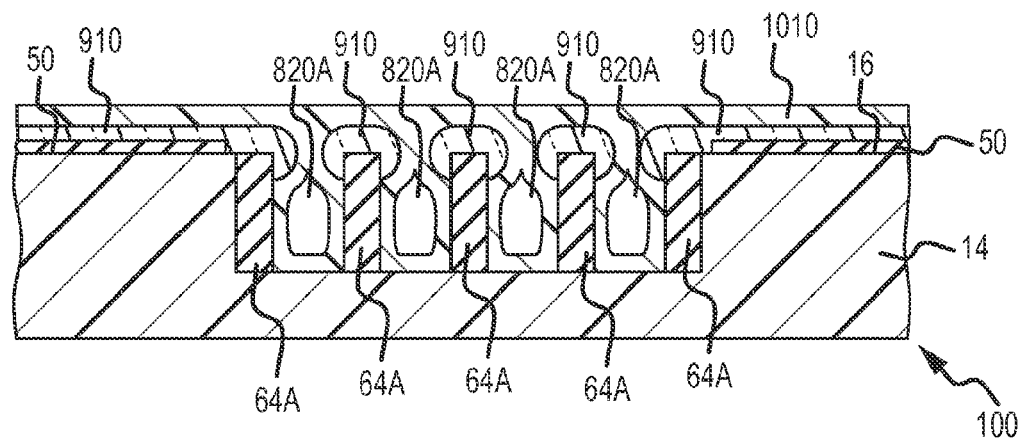
FIG. 10 is a cross-sectional view of the semiconductor structure of FIG. 9 at a later stage of manufacture.

FIG. 10 is a cross-sectional view of the semiconductor structure of FIG. 9 at a later stage of manufacture. After formation of capping material 910, sealing material 1010 may be formed in a conformal process over capping material 910, cavities 820 and optionally over portions of the interior surfaces of cavities 820 to bridge the gaps between capping materials 910 over oxide structures 64A and seal cavity 820 of FIG. 9 to form sealed cavity 820A. For example sealing material 1010 may comprise an oxide or a nitride and may be formed using low pressure chemical vapor deposition (LPCVD), for example a hot wall tetraethylorthosilicon (TEOS) process to deposit silicon dioxide. In some embodiments sealing material 1010 may partially or completely line cavity 820 of FIG. 9, and in other embodiments sealing material 1010 may not enter into cavity 820 of FIG. 9. The dielectric constant of the dielectric platform may be determined at least in part by the relative amounts of void space and dielectric, and since void space has a dielectric constant lower than that of dielectric, the overall dielectric constant of the dielectric platform may be relatively reduced, for example by increasing the volume of sealed cavities 820A, reducing the volume of dielectric material in dielectric structures 64A, and/or reducing the amount of dielectric capping material 910 and sealing material 1010 contained in dielectric platform 18. In some embodiments sealing material 1010 may have a thickness in the range of about 0.25 μm to about 4 μm.

In some embodiments sealing material 1010 may hermetically seal cavity 64A. In other embodiments an optional layer (not shown), for example, silicon nitride ($Si_3N_4$), may be formed over sealing material 1010 to hermetically seal cavity 64A. The optional silicon nitride layer may be formed using a low pressure chemical vapor deposition (LPCVD) technique and may have a thickness ranging from about 100 Å to about 1,000 Å.

In some embodiments, sealed cavity 820A is evacuated to a pressure less than atmospheric pressure. In other words, the pressure in sealed cavity 820A is below atmospheric pressure. As an example, the pressure in sealed cavity 820A may range from about 0.1 Torr to about 10 Torr. The type of substance or material within cavity 820A is not a limitation of the present invention. For example, sealed cavity 820A may contain solid matter or a fluid such as a gas or a liquid.

Referring back to FIG. 1, the portions of sealing material 1010, capping material 910, and silicon dioxide layer 50 in active regions 20 and 21 are removed after the formation of sealing material 1010. Active and passive semiconductor devices may be formed in or from the portions of substrate 14 adjacent dielectric platform 18. In addition, active or passive circuit elements, or portions thereof, may be formed on dielectric platform 18. By way of example, a passive circuit element 24 is formed on dielectric platform 18.

Although four capped or sealed cavities 64A are described with reference to FIGS. 1-10, the scope of the claimed subject matter is not limited in this regard. In other embodiments, the number of sealed cavities may be smaller or greater than shown in this example. Sealing material 1010 and capping material 910 in combination with oxide structures 64A and sealed cavities 820A form dielectric platform (DP) 18 as shown in FIG. 1.

Although dielectric platform 18 is described as having one or more cavities 820A, scope of the claimed subject matter is not limited in this regard. For example, in alternate embodiments, cavity 820A could be filled with a material, such as, for example, a material comprising an oxide, nitride, or silicon if so desired, to form a solid or filled dielectric platform (not shown) that is devoid of any cavities. Such a solid filled dielectric platform would have a relatively higher dielectric constant compared to a sealed cavity dielectric platform such as dielectric platform 18 since the material used to fill cavity 820A would have a higher dielectric constant compared to a cavity, opening, or void. Examples of materials that may be used to fill, or backfill, cavity 820A may include silicon nitride, polycrystalline silicon, or an oxide material formed using, for example, a hot wall tetraethylorthosilicon (TEOS) process.

As discussed above, the dielectric constant of DP 18 may be minimized, or nearly minimized, by increasing the volume of sealed cavities 820A, reducing the volume of dielectric material in dielectric structures 64A, and reducing the amount of dielectric layer 50, dielectric capping material 910 and sealing material 1010 contained in dielectric platform 18. Semiconductor structure 100 has one or more dielectric structures 64A that act to increase the dielectric constant of dielectric platform 18. In another embodiment of the present invention, the number of dielectric structures 64A may be reduced or eliminated to increase the volume of void space and relatively decrease the dielectric constant.

Figure 11:
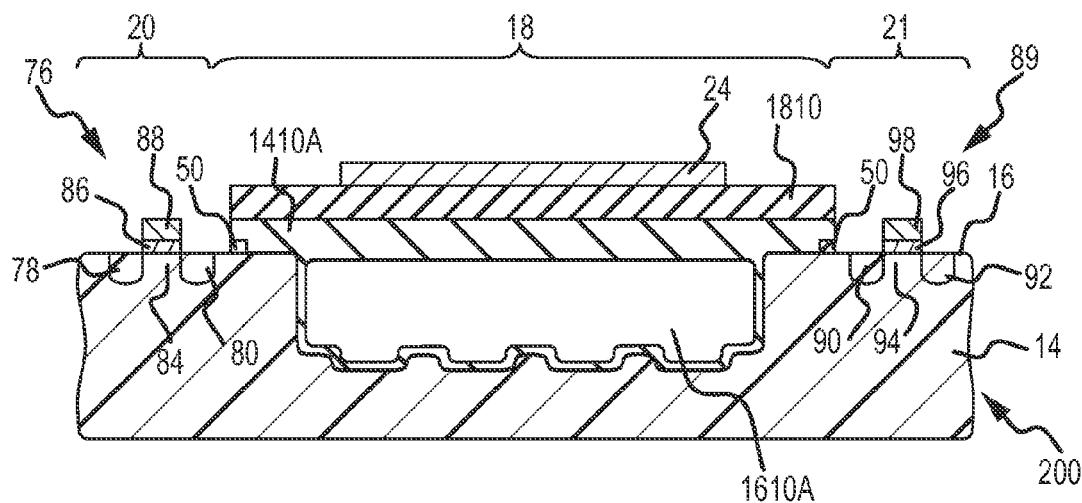
FIG. 11 is a cross-sectional view of another semiconductor structure in accordance with another embodiment of the present invention at an early stage of manufacture.

FIG. 11 is a cross-sectional view of semiconductor structure 200 in accordance with another embodiment. Semiconductor structure 200 comprises dielectric platform (DP) 18, active regions 20 and 21, and an electrically conductive material 24 in accordance with an embodiment of the present invention. Dielectric platform 18 may be referred to as a dielectric structure or a dielectric region, and active regions 20 and 21 may also be referred to as active area regions, active areas, or portions of active areas since active devices, or portions of active devices, typically are formed in active regions 20 and 21.

Dielectric platform 18 of semiconductor structure 200 comprises a sealed cavity 1610A bounded by dielectric material 1410A. In addition to sealed cavity 1610A and dielectric material 1410A, dielectric platform 18 shown in FIG. 11 includes optional support layer 1810.

Figure 12:
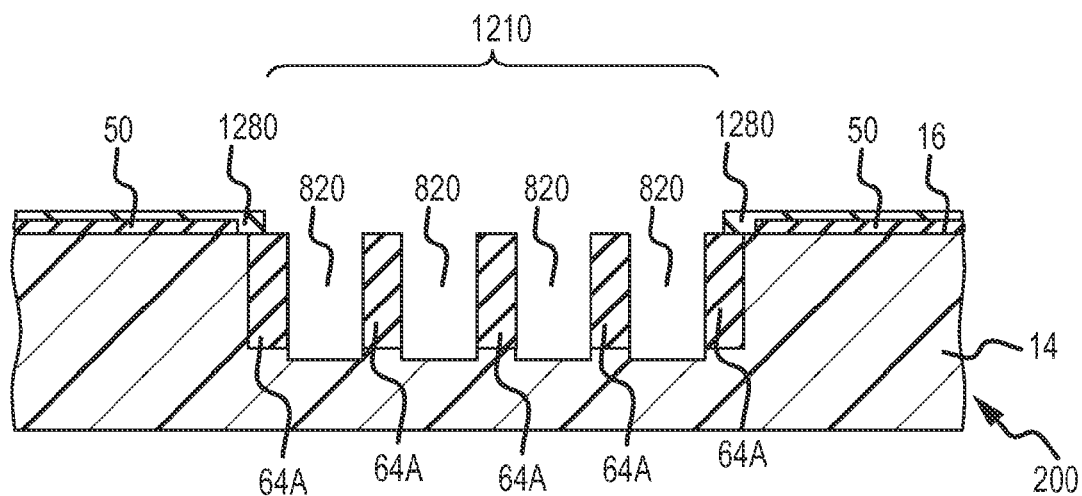
FIG. 12 is a cross-sectional view of the semiconductor structure of FIG. 11 at an earlier stage of manufacture.

In one embodiment, the initial processing steps for forming semiconductor structure 200 shown in FIG. 11 may be the same as described in FIGS. 2-7. Accordingly FIG. 12 is a cross-sectional view of the semiconductor structure of FIG. 7 at a later stage of manufacture. After removal of portions of silicon oxide 710 of FIG. 7 above a plane parallel to surface 16 of substrate 14, the remaining silicon oxide 710 (FIG. 7) may form oxide structures 64A.

After formation of oxide structures 64A, a layer of photoresist 1280 may be dispensed over oxide layer 50, oxide structures 64A and the exposed surface 16 of substrate 14 and patterned to form opening 1210. Portions of the exposed portions of substrate 14 may then be removed to form cavities 820. The exposed portions of substrate 14 may be removed, removed for example by using an isotropic or anisotropic etch process such as, for example, wet chemical etching or a reactive ion etch (RIE). In some embodiments, the etchant has a higher selectivity between silicon and silicon oxide. In other words the etch rate for silicon may be relatively higher than for oxide. In one embodiment the etch rate of silicon may be at least 10 times greater than the etch rate of oxide. In another embodiment the etch rate of silicon may be at least 50 times greater than the etch rate of oxide. After formation of cavities 820, photoresist 1280 may be stripped or removed.

In the example shown in FIG. 12, the bottom of cavity 820 is shown as being as below the level of the bottom of oxide structure 64A. In some embodiments, the height of oxide structures 64A may range from about 1 µm to about 40 µm and the depth of open cavities 820 may range from about 1 µm to about 50 µm. However the scope of the claimed subject matter is not limited in this respect, and in other embodiments the bottom of cavity 820 may be either above or equal to the bottom of oxide structure 64A.

Figure 13:
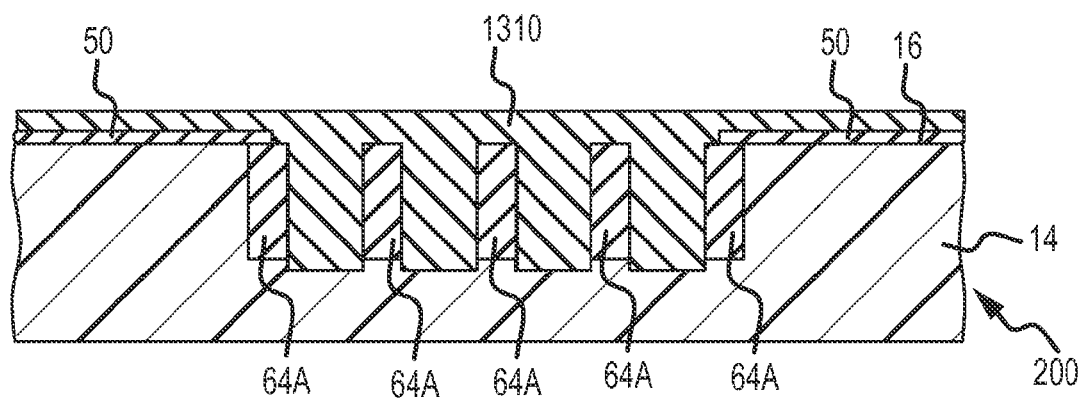
FIG. 13 is a cross-sectional view of the semiconductor structure of FIG. 12 at a later stage of manufacture.

FIG. 13 is a cross-sectional view of the semiconductor structure of FIG. 12 at a later stage of manufacture. After removal of photoresist 1280, cavities 820 of FIG. 12 may be filled with dielectric material 1310 that will subsequently form oxide structures 820A. In some embodiments dielectric material 1310 may be formed in a conformal process. For example dielectric material 1310 may comprise an oxide or a nitride. In other embodiments dielectric material 1310 may comprise phosphorus silicate glass (PSG), boron silicate glass (BSG), or boron phosphorus silicate glass (BPSG). Suitable techniques for forming dielectric material 1310 may include Chemical Vapor Deposition (CVD), plasma Enhanced CVD (PECVD), low pressure CVD (LPCVD), sputtering, evaporation, or the like. In one example dielectric material 1310 may comprise silicon oxide and may be formed using low pressure chemical vapor deposition (LPCVD), for example using a hot wall tetraethylorthosilicon (TEOS) process. In some embodiments dielectric material 1310 may completely, or nearly completely, fill cavity 820 of FIG. 12, and in other embodiments dielectric material 1310 may partially fill cavity 820 of FIG. 12.

In contrast to other processes used to form a dielectric platform, in accordance with one or more embodiments dielectric material 1310 is deposited and is not formed by the partial oxidation or nitridation of substrate 14, or using any other process that consumes a portion of substrate 14. Oxidation or nitridation of substrate 14 may create higher stress in the semiconductor and lead to the generation of defects that can adversely affect device performance. In one or more embodiments dielectric material 710 may be deposited, resulting in relatively lower stress and thus may reduce or eliminate the generation of defects.

Figure 14:
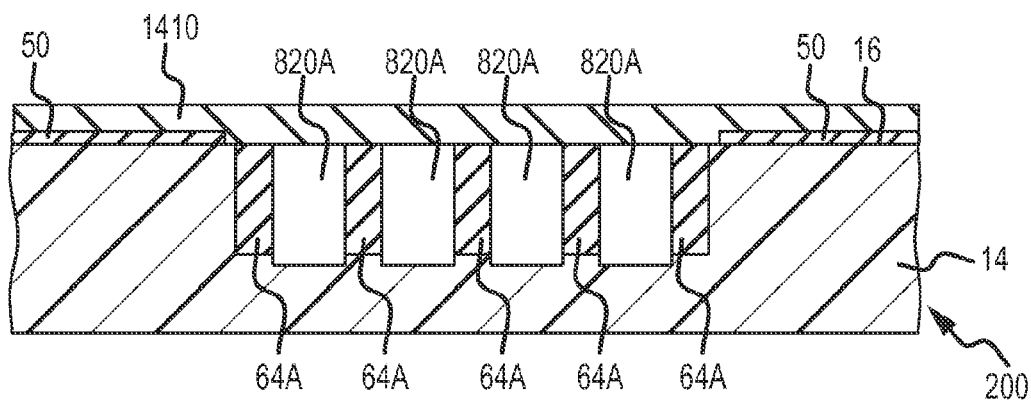
FIG. 14 is a cross-sectional view of the semiconductor structure of FIG. 13 at a later stage of manufacture.

FIG. 14 is a cross-sectional view of the semiconductor structure of FIG. 13 at a later stage of manufacture. After formation of dielectric material 1310, the portions of dielectric material 1310 above a plane parallel to surface 16 of substrate 14 may be removed, for example by etching or by chemical mechanical polishing (CMP), forming oxide structures 820A. In the example where dielectric material 1310 is silicon oxide, silicon oxide 1310 may be removed using a blanket or an anisotropic etch, for example RIE. The process to remove portions of silicon oxide 1310 above a plane parallel to surface 16 of substrate 14 may also optionally remove silicon oxide layer 50. In the example shown in FIG. 14, silicon oxide layer 50 is not removed. In the example shown in FIG. 14, dielectric material 1310 is removed such that the top of oxide structures 820A is level with surface 16 of substrate 14 and the top of oxide structures 64A. However the scope of the claimed subject matter is not limited in this respect, and in other embodiments the top of oxide structures 64A may be at a height above or below surface 16 of substrate 14 and the top of oxide structures 820A may be at a height above or below surface 16 of substrate 14. Furthermore, the tops of oxide structure 820A and oxide structure 64A may or may not be at the same height. After formation of oxide structures 820A, capping layer 1410 may be formed over portions of substrate 14, dielectric structures 64A, oxide layer 50 and dielectric structures 820A.

Capping layer 1410 may comprise a material for which a selective etch exists with respect to the material comprising dielectric structures 64A and 820A. In one embodiment, in subsequent processing steps openings will be formed in capping layer 1410 to permit the introduction of an etchant to remove dielectric structures 64A and 820A. The etchant should have a relatively high etch rate for the material comprising dielectric structures 64A and 820A compared to the material comprising capping layer 1410, such that not all of capping layer 1410 is removed prior to removal of dielectric structures 64A and 820A. In one example the etch rate of the material comprising dielectric structures 64A and 820A may be at least ten times higher than the etch rate of the material comprising capping layer 1410. In another example, the etch rate of the material comprising dielectric structures 64A and 820A may be at least one hundred times higher than the etch rate of the material comprising capping layer 1410. In one example capping layer 1410 may comprise polysilicon or silicon nitride and dielectric structures 64A and 820A may comprise silicon oxide. Suitable techniques for forming capping layer 1410 may include Chemical Vapor Deposition (CVD), plasma Enhanced CVD (PECVD), low pressure CVD (LPCVD), sputtering, evaporation, spinning on or the like. In one example capping layer 1410 may have a thickness in the range of about 0.1 μm to about 10 μm.

Figure 15:
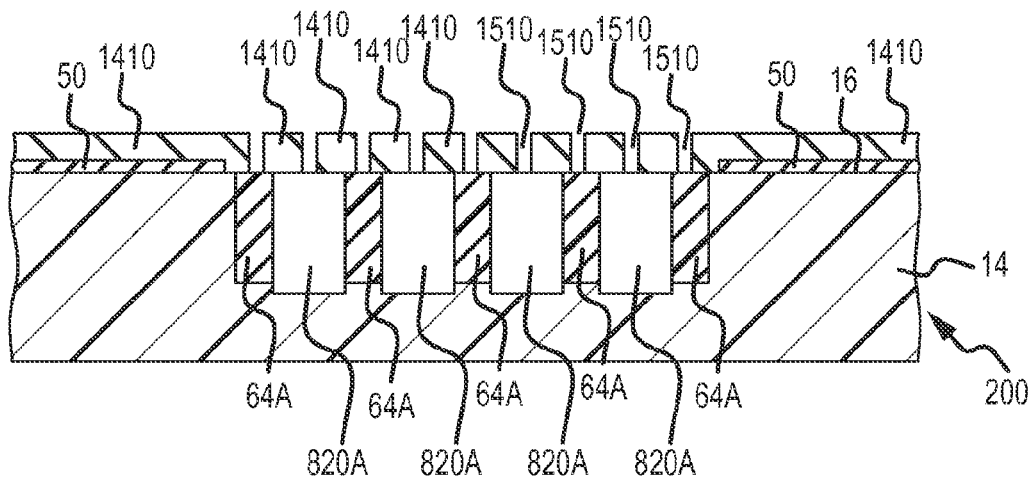
FIG. 15 is a cross-sectional view of the semiconductor structure of FIG. 14 at an earlier stage of manufacture.

FIG. 15 is a cross-sectional view of the semiconductor structure of FIG. 14 at a later stage of manufacture. After formation of capping layer 1410, capping layer 1410 may be patterned to form openings 1510 in capping layer 1410. In one example, a layer of photoresist (not shown) may be dispensed over capping layer 1410 (FIG. 14) and patterned to form openings exposing portions of capping layer 1410 that may then be removed to form openings 1510. The exposed portions of capping layer 1410 may be removed, for example by using an isotropic or anisotropic etch process such as, for example, wet chemical etching or a reactive ion etch (RIE). The width of openings 1510 may be sufficient to permit a subsequent etchant to access dielectric structures 64A and 820A and to permit removal of etching products, yet may be small enough to permit subsequent capping. In one example openings 1510 may have a width in the range of about 0.1 μm to about 1 μm. However the scope of the claimed subject matter is not limited in this respect, and in other embodiments openings 1510 may be smaller or larger.

Figure 16:
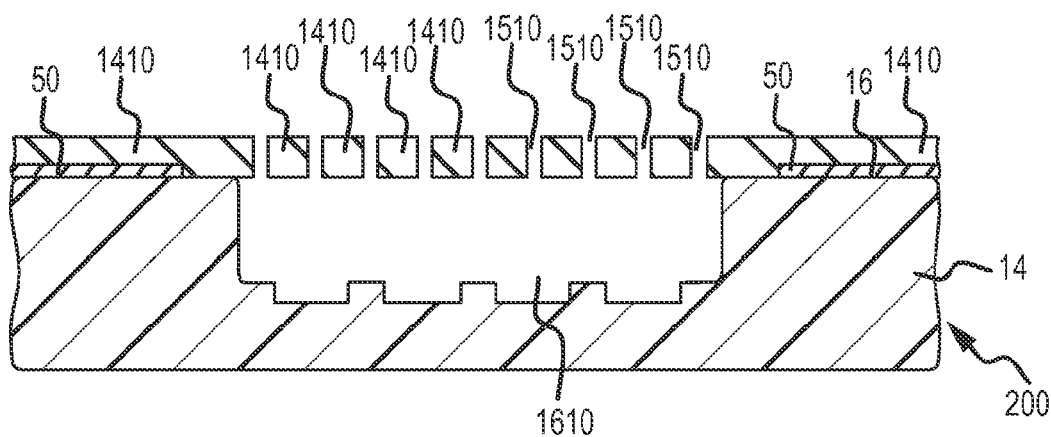
FIG. 16 is a cross-sectional view of the semiconductor structure of FIG. 15 at a later stage of manufacture.

FIG. 16 is a cross-sectional view of the semiconductor structure of FIG. 15 at a later stage of manufacture. After formation of openings 1510 in capping layer 1410, dielectric structures 64A and 820A may be removed resulting in the formation of a single open cavity 1610 with a plurality of openings 1510. Open cavity 1610 may also be referred to as a cavity, a gap, a void, an open cell or the like. Dielectric structures 64A and 820A may be removed, for example by using an etchant that has a relatively higher etch rate for the materials that comprise dielectric structures 64A and 820A compared to the etch rate for materials that comprise capping layer 1410, as discussed above. The etchant may be either anisotropic or isotropic and may be a wet chemical etch, a dry, for example RIE etch or a vapor etch. In one example in which dielectric structures 64A and 820A comprise silicon oxide and capping layer 1410 comprises polysilicon, the etchant may comprise either a hydrofluoric (HF) based wet chemical etch or a HF-based vapor etch. In one example all or substantially all of dielectric structures 64A and 820A may be removed. However the scope of the claimed subject matter is not limited in this respect, and in other embodiments a portion of either dielectric structures 64A and/or 820A may be removed. In another embodiment, the previously deposited photoresist may be left over capping layer 1410 and portions of capping layer 1410 and all or portions of dielectric structures 64A and 820A may be removed using one etching step.

The removal of dielectric structures 64A and 820A results in the formation of a single open cavity 1610 with a plurality of openings 1510. The width of cavity 1610 may be approximately $n1*w1+n2*w2$, where $n1$ and $n2$ are the number of dielectric structures 64A and 820A respectively and $w1$ and $w2$ are the widths of dielectric structures 64A and 820A respectively. In the example shown in FIGS. 12-15, $n1=5$ and $n2=4$, however the scope of the claimed subject matter is not limited in this respect, and in other embodiments, $n1$ and $n2$ may be either larger or smaller than the values presented in this example. Using $n1$ and $n2$ from FIGS. 12-15, In one example $w1$ may be about 1 μm and $w2$ may be about 2 μm, resulting in a width of open cavity 1610 of 13 μm. However the scope of the claimed subject matter is not limited in this respect, and in other embodiments the width of cavity 1610 may be either smaller or larger. As the width of cavity 1610 increases, the thickness of capping layer 1410 may increase to retain the integrity of capping layer 1410 and ensure no cracks or breakage in this layer.

Figure 17:
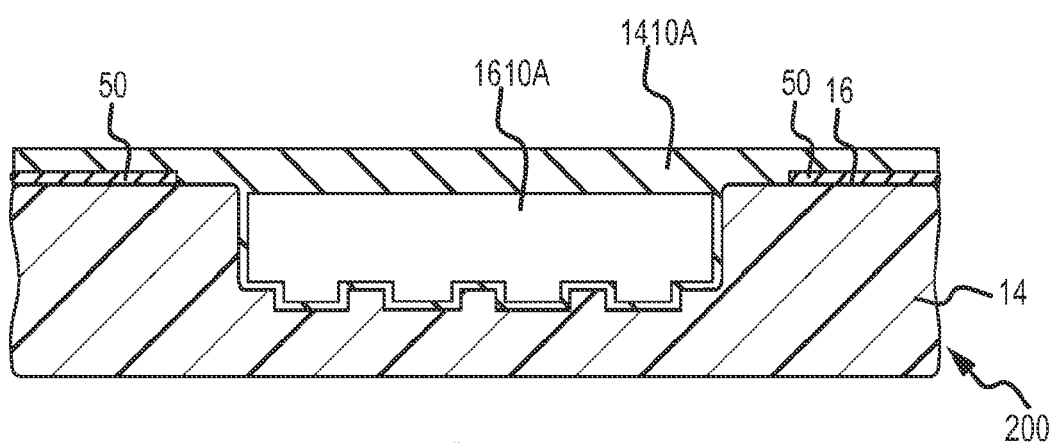
FIG. 17 is a cross-sectional view of the semiconductor structure of FIG. 16 at a later stage of manufacture.

FIG. 17 is a cross-sectional view of the semiconductor structure of FIG. 16 at a later stage of manufacture. After removal of dielectric structures 64A and 820A, open cavity 1610 of FIG. 16 may be sealed to form closed cavity 1610A. Closed cavity 1610A may also be referred to as a sealed cavity, a sealed gap, a closed void, a closed cell or the like. In one embodiment in which capping layer 1410 comprises polysilicon, for example as shown in FIG. 11, FIG. 17 and/or FIG. 18, polysilicon layer 1410 may be oxidized to form silicon oxide. Because of the about 2.2 times volume expansion that occurs when silicon is oxidized, the oxide will expand laterally into openings 1510 of FIG. 16 and eventually close openings 1510 of FIG. 16, thereby forming sealed cavity 1610A. In one embodiment of the present invention, the oxidizing ambient may also enter into open cavity 1610 of FIG. 16 and oxidize the interior surfaces of open cavity 1610 of FIG. 16 at the same time, or nearly at the same time, as openings 1510 FIG. 16 are being closed by the oxidation process. However the scope of the claimed subject matter is not limited in this respect, and in other embodiments only a portion of, or none of, the interior surfaces of open cavity 1610 of FIG. 16 may be oxidized. In the example shown in FIG. 17, polysilicon layer 1410 may be completely, or nearly completely, oxidized to form a continuous, or nearly continuous, oxide layer 1410A over sealed cavity 1610A and over the interior surfaces of sealed cavity 1610A. However the scope of the claimed subject matter is not limited in this respect, and in other embodiments polysilicon layer 1410 may not be completely oxidized.

The thickness of oxide layer 1410A may depend in part on the width of openings 1510 of FIG. 16. Relatively smaller openings 1510 of FIG. 16 may utilize a smaller amount of oxide to form sealed cavity 1610A. A relatively smaller oxide thickness may result in lower stress induced by both the volume expansion of silicon upon oxidation and the different coefficients of thermal expansion in semiconductor structure 200. In one example oxide layer 1410A may be in the range of about 0.1 μm to about 2 μm.

In another embodiment (not shown), a sealing material may be formed in a conformal or non-conformal process over capping layer 1410 of FIG. 16 and open cavity 1610 of FIG. 16 to close openings 1510 of FIG. 16 in capping layer 1410 of FIG. 16 to form sealed cavity 1610A. For example the sealing material may comprise an oxide or a nitride and may be formed using low pressure chemical vapor deposition (LPCVD), for example a hot wall tetraethylorthosilicon (TEOS) process to deposit silicon dioxide. In some embodiments the sealing material may partially or completely line cavity 1610A and in other embodiments the sealing material may not enter into cavity 1610A. In some embodiments the sealing material may have a thickness in the range of about 0.25 μm to about 4 μm.

In some embodiments, sealed cavity 1610A may be evacuated to a pressure less than atmospheric pressure. In other words, the pressure in sealed cavity 1610A may be below atmospheric pressure. As an example, the pressure in sealed cavity 1610A may range from about 0.1 Torr to about 10 Torr. The type of substance or material within cavity 1610A is not a limitation of the present invention. For example, sealed cavity 1610A may contain solid matter or a fluid such as a gas or a liquid.

Figure 18:
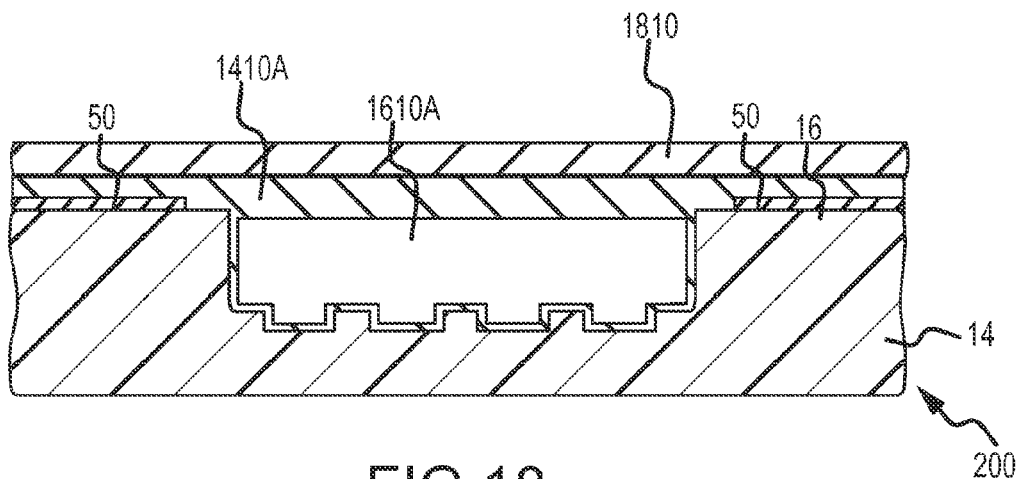
FIG. 18 is a cross-sectional view of the semiconductor structure of FIG. 17 at a later stage of manufacture.

FIG. 18 is a cross-sectional view of the semiconductor structure of FIG. 17 at a later stage of manufacture. After formation of sealed cavity 1610A, an optional support layer 1810 may be formed over capping layer 1410A. Optional support layer 1810 may be used to impart additional structural rigidity to dielectric platform 18 of FIG. 11, and/or to ensure that sealed cavity 1610A is spanned without cracking or breakage which could destroy the integrity of sealed cavity 1610A. In one embodiment of the present invention support layer 1810 may be formed in a conformal or non-conformal process over oxide layer 1410A. For example optional support material 1810 may comprise an oxide or a nitride and may be formed using low pressure chemical vapor deposition (LPCVD), for example a hot wall tetraethylorthosilicon (TEOS) process to deposit silicon dioxide. In some embodiments support layer 1810 may have a thickness in the range of about 0.25 μm to about 20 μm.

Oxide layer 1410A in combination with sealed cavity 1610A and optional support layer 1810 form dielectric platform (DP) 18 shown in FIG. 11. Although one sealed cavity 1610A is described with reference to FIGS. 12-18, the scope of the claimed subject matter is not limited in this regard. In other embodiments, dielectric platform 18 of FIG. 11 may comprise two or more sealed cavities 1610A.

Referring back to FIG. 11, the portions of oxide layer 1410A, silicon dioxide layer 50 and optional support layer 1810 in active regions 20 and 21 may be removed after the formation of oxide layer 1410A and optional support layer 1810. Active and passive semiconductor devices may be formed in or from the portions of substrate 14 adjacent dielectric platform 18. In addition, active or passive circuit elements, or portions thereof, may be formed on dielectric platform 18. By way of example, a passive circuit element 24 is formed on dielectric platform 18.

Although dielectric platform 18 is described as having one sealed cavity 1610A, the scope of the claimed subject matter is not limited in this regard. For example, in alternate embodiments, cavity 1610A optionally could be filled with a material, such as, for example, a material comprising an oxide, nitride, or silicon, to form a solid or filled dielectric platform (not shown) that is devoid or nearly devoid of any cavities. Such a solid filled dielectric platform would have a relatively higher dielectric constant compared to a sealed cavity dielectric platform such as dielectric platform 18 since the material used to fill cavity 1610A would have a higher dielectric constant compared to a cavity, opening, or void. Examples of materials that may be used to fill, or backfill, cavity 16610A may include silicon nitride, polycrystalline silicon, or an oxide material formed using, for example, a hot wall tetraethylorthosilicon (TEOS) process.

As discussed above, the dielectric constant of dielectric platform 18 may be minimized, or nearly minimized, by increasing the volume of sealed cavity 1610A, for example by reducing the depth of the dielectric platform, reducing the volume of oxide in oxide layer 1410A and/or reducing the amount of dielectric material in optional support layer 1810 contained in dielectric platform 18.

Figure 19:
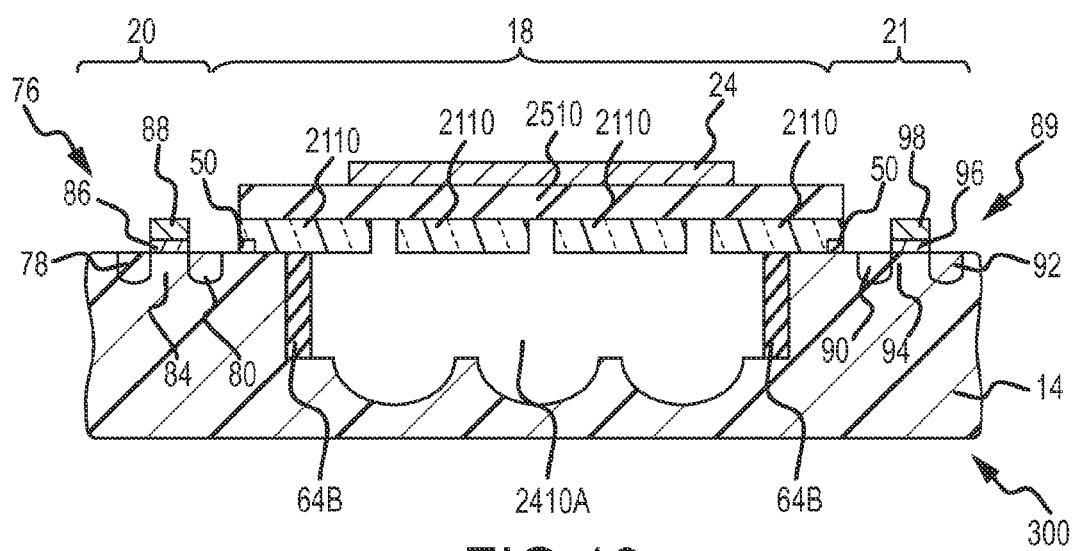
FIG. 19 is a cross-sectional view of another semiconductor structure in accordance with another embodiment of the present invention at an early stage of manufacture.

FIG. 19 is a cross-sectional view of semiconductor structure 300 in accordance with another embodiment. Semiconductor structure 300 comprises dielectric platform (DP) 18, active regions 20 and 21, and an electrically conductive material 24 in accordance with an embodiment of the present invention. Dielectric platform 18 may be referred to as a dielectric structure or a dielectric region, and active regions 20 and 21 may also be referred to as active area regions, active areas, or portions of active areas since active devices, or portions of active devices, typically are formed in active regions 20 and 21. Dielectric platform 18 of semiconductor structure 300 comprises sealed cavity 2410A, dielectric structures 64B, dielectric layer 50, capping layer 2110 and sealing layer 2510.

Figure 20:
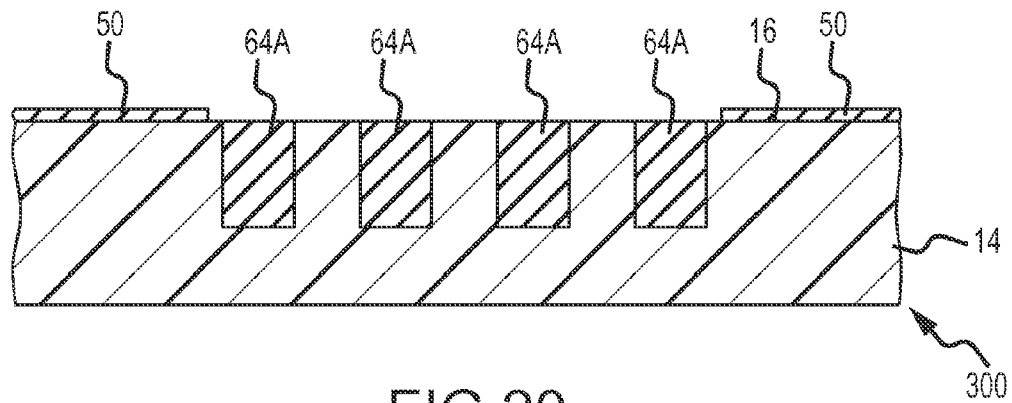
FIG. 20 is a cross-sectional view of the semiconductor structure of FIG. 19 at an earlier stage of manufacture.

In one embodiment of the present invention the initial processing steps for semiconductor structure 300 shown in FIG. 19 may be the same as described in FIGS. 2-7. Accordingly FIG. 20 is a cross-sectional view of the semiconductor structure of FIG. 7 at a later stage of manufacture. After removal of portions of silicon oxide 710 of FIG. 7 above a plane parallel to surface 16 of substrate 14, the remaining silicon oxide 710 of FIG. 7 may form oxide structures 64A. In the example shown in FIG. 20, the width of openings 44 of FIG. 2 and masked areas 48 FIG. 2 are substantially equal. However the scope of the claimed subject matter is not limited in this respect, and in other embodiments, for example shown in FIG. 2, the width of openings 44 of FIG. 2 and masked areas 48 of FIG. 2 may not be equal. In the example shown in FIG. 20, the width of oxide structures 64A may be in the range of about 1 μm to about 15 μm and the spacing between oxide structures 64A may be in the range of about 1 μm to about 15 μm.

Figure 21:
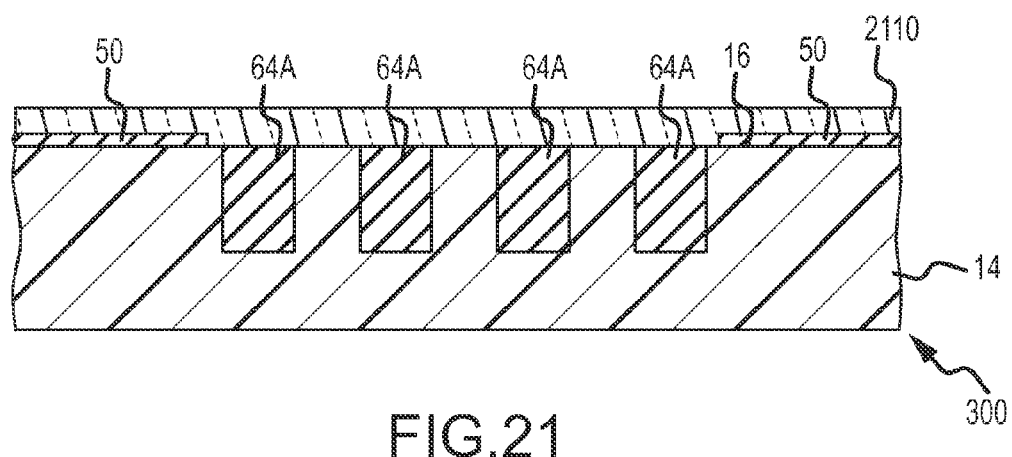
FIG. 21 is a cross-sectional view of the semiconductor structure of FIG. 20 at a later stage of manufacture.

FIG. 21 is a cross-sectional view of the semiconductor structure of FIG. 20 at a later stage of manufacture. After formation of oxide structures 64A, capping layer 2110 may be formed over oxide layer 50, dielectric structures 64A and portions of substrate 14.

Capping layer 2110 may comprise a material for which a selective etch exists with respect to the material comprising substrate 14. In one embodiment openings will subsequently be formed in capping layer 2110 to permit the introduction of an etchant to remove portions of substrate 14. The etchant should have a relatively high etch rate for the material comprising substrate 14 compared to the material comprising capping layer 2110, such that not all of capping layer 2110 is removed prior to completion of the etch of portions of substrate 14. In one example the etch rate of the material comprising substrate 14 may be at least ten times higher than the etch rate of the material comprising capping layer 2110. In another example, the etch rate of the material comprising substrate 14 may be at least one hundred times higher than the etch rate of the material comprising capping layer 2110. In one example of the present invention, the etchant used to remove portions of substrate 14 may also have a relatively low etch rate for the material comprising dielectric structures 64A. In one example capping layer 2110 may comprise silicon nitride and dielectric structures 64A may comprise silicon oxide. Suitable techniques for forming capping layer 2110 may include Chemical Vapor Deposition (CVD), plasma Enhanced CVD (PECVD), low pressure CVD (LPCVD), sputtering, evaporation, spinning on or the like. In one example capping layer 2110 may have a thickness in the range of about 0.1 μm to about 10 μm.

Figure 22:
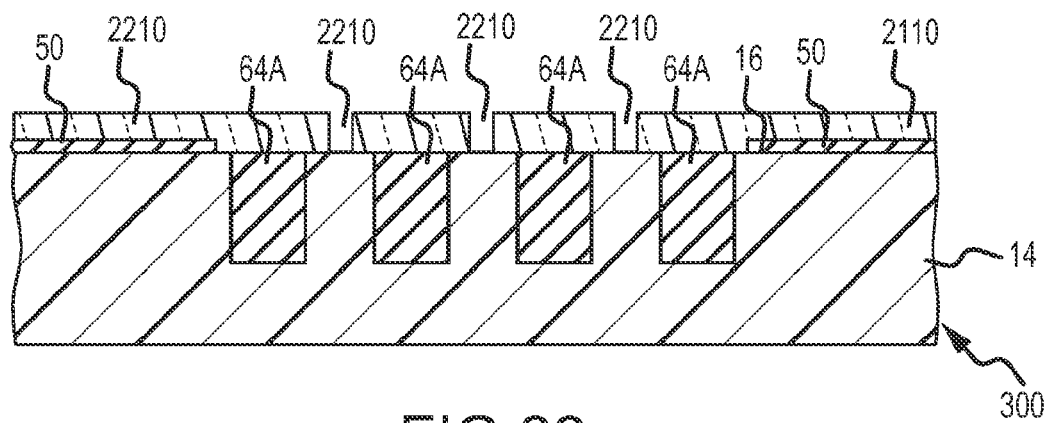
FIG. 22 is a cross-sectional view of the semiconductor structure of FIG. 21 at a later stage of manufacture.

FIG. 22 is a cross-sectional view of the semiconductor structure of FIG. 21 at a later stage of manufacture. After formation of capping layer 2110, capping layer 2110 may be patterned to form openings 2210 in capping layer 2110. In one example, a layer of photoresist (not shown) may be dispensed over capping layer 2110 of FIG. 20 and patterned to form openings exposing portions of capping layer 2110 that may then be removed to form openings 2210. The exposed portions of capping layer 2110 may be removed, for example by using an isotropic or anisotropic etch process such as, for example, wet chemical etching or a reactive ion etch (RIE). The width of openings 2210 may be sufficient to permit a subsequent etchant to access substrate 14 and to permit removal of etching products, yet may be small enough to permit subsequent capping. In one example openings 2210 may have a width in the range of about 0.1 µm to about 1 µm. However the scope of the claimed subject matter is not limited in this respect, and in other embodiments openings 2210 may be smaller or larger.

Figure 23:
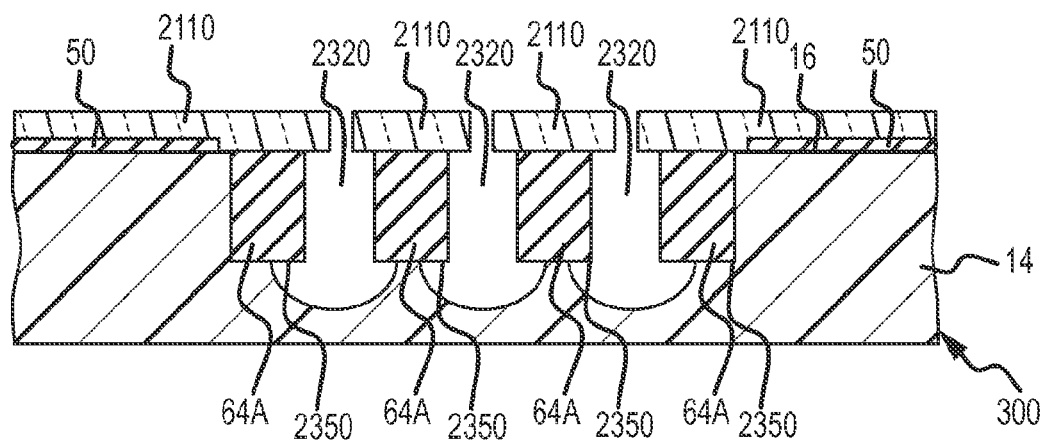
FIG. 23 is a cross-sectional view of the semiconductor structure of FIG. 22 at a later stage of manufacture.

FIG. 23 is a cross-sectional view of the semiconductor structure of FIG. 22 at a later stage of manufacture. After formation of openings 2210 of FIG. 22 in capping layer 2110, portions of substrate 14 between dielectric structures 64A may be removed resulting in the formation of open cavities 2320. Open cavities 2320 may also be referred to as a cavity, a gap, a void, an open cell or the like. Portions of substrate 14 may be removed, for example by using an etchant that has a relatively high etch rate for the materials that comprise substrate 14 compared to the etch rate for materials that comprise capping layer 2110, as discussed above. The etchant may be either anisotropic or isotropic and may be a wet chemical etch, a dry, for example RIE etch or a vapor etch. In one example in which substrate 14 comprises silicon and capping layer 2110 comprises silicon nitride, the etchant may comprise either a wet chemical etch or a vapor etch. In one example all, or substantially all, of the portions of substrate 14 between dielectric structures 64A may be removed. However the scope of the claimed subject matter is not limited in this respect, and in other embodiments only a portion of the portion of substrate 14 between dielectric structures 64A may be removed. In yet another embodiment, portions of substrate 14 below bottom surface 2350 of dielectric structures 64A may also be removed. In one example, shown in FIG. 23, the etchant is an isotropic etch and has removed all of the portion of substrate 14 between dielectric structures 64A as well as a portion of substrate 14 below bottom surface 2350 of dielectric structures 64A. In such an example, relatively more silicon is removed from the dielectric platform, resulting in a lower overall dielectric constant of dielectric platform 18. In one embodiment of this example, the lateral etching of substrate 14 below bottom surface 2350 of dielectric structures 64A may be limited so as not to permit meeting of etch fronts from two adjacent cavities 2320. However, the scope of the claimed subject matter is not limited in this respect, and in other embodiments, the bottom surface of cavities 2320 may be coplanar, or nearly coplanar, with bottom surface 2350 of dielectric structures 64A or the bottom surface of cavities 2320 may be at a level higher or lower than bottom surface 2350 of dielectric structures 64A. In another embodiment of the present invention, the previously deposited photoresist may be left over capping layer 2110 and portions of capping layer 2110 and portions of substrate 14 may be removed using one etching step.

Figure 24:
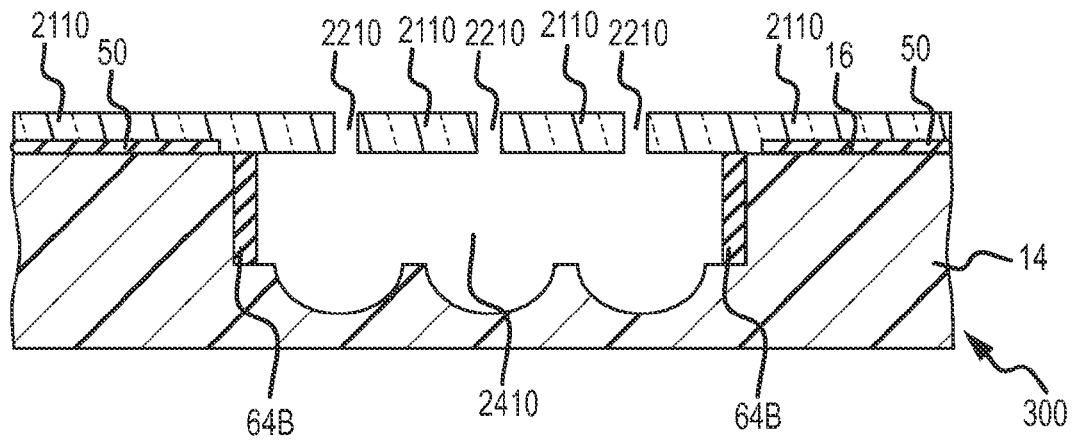
FIG. 24 is a cross-sectional view of the semiconductor structure of FIG. 23 at a later stage of manufacture.

FIG. 24 is a cross-sectional view of the semiconductor structure of FIG. 23 at a later stage of manufacture. After removal of portions of substrate 14 between dielectric structures 64A of FIG. 23, portions of dielectric structures 64A of FIG. 23 may be removed to form a single open cavity 2410 with a plurality of openings 2210. Open cavity 24100 may also be referred to as a cavity, a gap, a void, an open cell or the like. The width of cavity 2410 may be approximately $n1*w1 + n2*w2$, where n1 and n2 are the number of dielectric structures 64A of FIG. 23 and the number of open cavities 2320 of FIG. 23, respectively, and w1 and w2 are the widths of dielectric structures 64A of FIG. 23 and the spacing between dielectric structures 64A of FIG. 23, respectively. In the example shown in FIGS. 20-23, n1=4 and n2=3, however the scope of the claimed subject matter is not limited in this respect, and in other embodiments, n1 and n2 may be either larger or smaller than the values presented in this example. In one example w1 may be about 3 µm and w2 may be about 3 µm, resulting in a width of cavity 1610 of 21 µm. However the scope of the claimed subject matter is not limited in this respect, and in other embodiments the width of cavity 2410 may be either smaller or larger. As the width of cavity 2410 increases, the thickness of capping layer 2110 may increase to retain the integrity of capping layer 2110 and ensure little or no cracks or breakage in this layer.

Portions of dielectric structures 64A of FIG. 23 may be removed, for example by using an etchant that has a relatively high etch rate for the materials that comprise dielectric structures 64A of FIG. 23 compared to the etch rate for materials that comprise capping layer 2110. The etchant may be either anisotropic or isotropic and may be a wet chemical etch, a dry, for example RIE etch or a vapor etch. In one example in which dielectric structures 64A of FIG. 23 comprises silicon oxide and capping layer 2110 comprises silicon nitride, the etchant may comprise either a wet chemical etch or a vapor etch. In one example all or substantially all of dielectric structures 64A of FIG. 23 may be removed. In another embodiment, as shown in FIG. 24, dielectric structures 64A of FIG. 23 on the edge of dielectric platform 18, that is adjacent to substrate 14, may be only partially removed while dielectric structures 64A of FIG. 23 within the interior of dielectric platform 18 are completely, or nearly completely, removed. In this example, a portion of dielectric structures 64A of FIG. 23 on the edge of dielectric platform 18 are partially removed, leaving dielectric structures 64B. However the scope of the claimed subject matter is not limited in this respect, and in other embodiments portions of or all of dielectric structures 64A may be removed. In another embodiment, the previously deposited photoresist used to pattern openings 2210 in capping layer 2110 may be may be left over capping layer 2110 and portions of capping layer 2110, portions of substrate 14 and portions or all of dielectric structures 64A of FIG. 23 may be removed using one or more etching steps.

Figure 25:
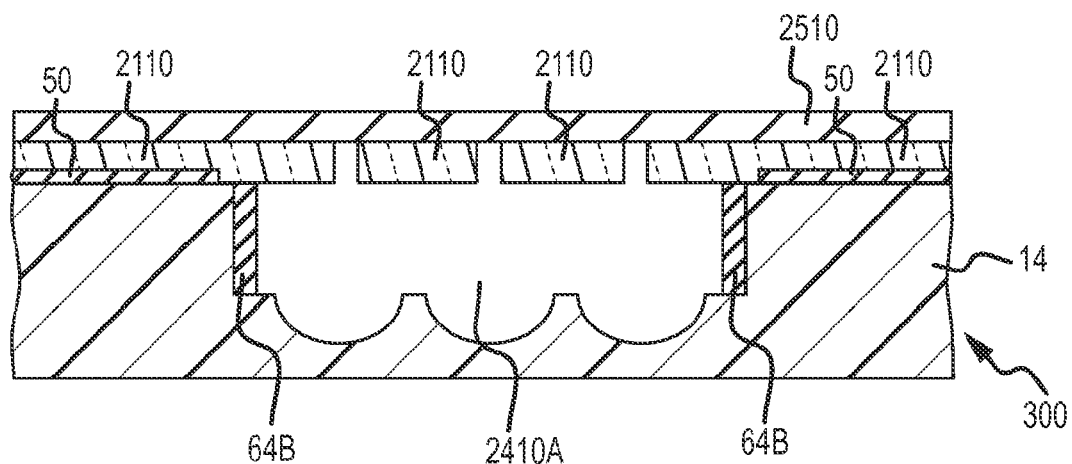
FIG. 25 is a cross-sectional view of the semiconductor structure of FIG. 24 at a later stage of manufacture.

FIG. 25 is a cross-sectional view of the semiconductor structure of FIG. 24 at a later stage of manufacture. After formation of open cavity 2410 of FIG. 24, sealing layer 2510 may be formed over openings 2210 of FIG. 24, open cavity 2410 and capping layer 2110 of FIG. 24 to form closed cavity 2410A.

Sealing layer 2510 may be formed in a conformal or non-conformal process over openings 2210 of FIG. 24 and capping layer 2110 to close openings 2110 of FIG. 24 in capping layer 2110 to form closed cavity 2410A. Closed cavity 2410A may also be referred to as a sealed cavity, a sealed gap, a closed void, a closed cell or the like. In one example sealing layer 2510 may comprise a dielectric material such a silicon oxide or silicon nitride and may be formed using low pressure chemical vapor deposition (LPCVD), for example a hot wall tetraethylorthosilicon (TEOS) process to deposit silicon dioxide. In other examples, sealing layer 2510 may be formed using a spin-on process, or by evaporation, sputtering or the like. In other embodiments sealing layer 2510 may partially enter into sealed cavity 2410A and in other embodiments sealing layer 2510 may not enter into cavity 2410A. In some embodiments sealing layer 2510 may have a thickness in the range of about 0.25 µm to about 4 µm.

In some embodiments, sealed cavity 2410A may be evacuated to a pressure less than atmospheric pressure. In other words, the pressure in sealed cavity 2410A may be below atmospheric pressure. As an example, the pressure in sealed cavity 2410A may range from about 0.1 Torr to about 10 Torr. However, this is one example of the type of substance or material within cavity 2410A, and the scope of the claimed subject matter is not limited in this respect. For example, sealed cavity 2410A may contain solid matter or a fluid such as a gas or a liquid.

In some embodiments an optional support layer (not shown) may be formed over sealing layer 2510. The optional support layer may be used to impart additional structural rigidity to dielectric platform 18 of FIG. 19 and to ensure that sealed cavity 2410A is spanned without cracking or breakage which would otherwise destroy the integrity of sealed cavity 2410A. In one embodiment of the optional support layer may be formed in a conformal or non-conformal process over sealing layer 2510. In one example the optional support material may comprise an oxide or a nitride and may be formed using low pressure chemical vapor deposition (LPCVD), for example a hot wall tetraethylorthosilicon (TEOS) process to deposit silicon dioxide. In other embodiments, optional support layer may be formed using a spin-on process, evaporation, sputtering or the like. In some embodiments the optional support layer may have a thickness in the range of about 0.25 µm to about 20 µm.

Capping layer 2110 and sealing layer 2510 in combination with sealed cavity 2410A, dielectric layer 50 and dielectric structures 64B form dielectric platform (DP) as 18 shown in FIG. 19. Although one sealed cavity 2410A is described with reference to FIGS. 19-25, the scope of the claimed subject matter is not limited in this regard. In other embodiments, dielectric platform 18 of FIG. 19 may comprise two or more sealed cavities 2410A.

Referring back to FIG. 19, the portions of dielectric layer 50, capping layer 2110 and sealing layer 2510 in active regions 20 and 21 are removed after the formation of sealing layer 2510. Active and passive semiconductor devices may be formed in or from the portions of substrate 14 adjacent dielectric platform 18. In addition, active or passive circuit elements, or portions thereof, may be formed on dielectric platform 18. By way of example, a passive circuit element 24 is formed on dielectric platform 18.

Although dielectric platform 18 is described as having one sealed cavity 2410A, the scope of the claimed subject matter is not limited in this regard. For example, in alternate embodiments, cavity 2410A could be filled with a material, such as, for example, a material comprising an oxide, nitride, or silicon if so desired, to form a solid or filled dielectric platform (not shown) that is devoid, or nearly devoid, of any cavities. Such a solid filled dielectric platform would have a relatively higher dielectric constant compared to a sealed cavity dielectric platform such as dielectric platform 18 since the material used to fill cavity 2410A would have a higher dielectric constant compared to a cavity, opening, or void. Examples of materials that may be used to fill, or backfill, cavity 2410A may include silicon nitride, polycrystalline silicon, or an oxide material formed using, for example, a hot wall tetraethylorthosilicon (TEOS) process.

Accordingly, various structures and methods have been disclosed to provide a relatively thicker, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively higher Q, and enable relatively higher frequency of operation of one or more devices formed using, or in conjunction with, a structure that includes the dielectric platform. In addition, the disclosed dielectric platform and/or the methods for making the dielectric platform may reduce thermal stress that may be imparted to regions adjacent to the dielectric platform compared to other techniques and structures. Further, methods and apparatuses have been disclosed that provide a semiconductor structure having a relatively high thermal conductivity, which may be utilized in applications where the efficient removal of heat is desired.

Although the claimed subject matter has been described with a certain degree of particularity, it should be recognized that elements thereof may be altered by persons skilled in the art without departing from the spirit and/or scope of claimed subject matter. It is believed that the subject matter pertaining to a semiconductor structure as discussed herein and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method for manufacturing a semiconductor device, the method comprising:
    forming at least two or more cavities below a surface of a semiconductor substrate wherein the at least two or more cavities are spaced apart from each other by a selected distance;
    filling at least a portion of the at least two or more cavities with a dielectric material to form at least two or more dielectric structures;
    removing a portion of the substrate between the at least two or more dielectric structures to form an additional cavity;
    depositing a capping material on the at least two or more dielectric structures; and
    covering the additional cavity and the capping material to form a sealed cavity.

2. The method of claim 1, wherein said removing a portion of the substrate comprises creating an opening to the additional cavity, and wherein said depositing a capping material comprises decreasing a size of the opening to the additional cavity.

3. The method of claim 1, wherein the capping material comprises an additional dielectric material.

4. The method of claim 3, wherein the additional dielectric material comprises silicon oxide, silicon nitride, or combinations thereof.

5. The method of claim 4, further comprising using a non-conformal deposition process to form the silicon oxide, silicon nitride, or combinations thereof.

6. The method of claim 1, wherein the dielectric material comprises silicon oxide, silicon nitride, or combinations thereof.

7. The method of claim 6, further comprising using a conformal deposition process to form the silicon oxide, silicon nitride, or combinations thereof.

8. The method of claim 1, wherein the at least two or more cavities are formed using a wet chemical etch, a dry etch, a reactive ion etch, or combinations thereof.

9. The method of claim 1, wherein the at least two or more cavities are formed using an anisotropic etch.

10. The method of claim 1, wherein the additional cavity is formed using a wet chemical etch, a dry etch, a reactive ion etch, or combinations thereof.

11. The method of claim 1, wherein the additional cavity is formed using an anisotropic etch.

12. The method of claim 1, wherein said covering the additional cavity comprises forming an additional material over the additional cavity and the at least two or more dielectric structures.

13. The method of claim 12, wherein the additional material comprises an additional dielectric material.

14. The method of claim 13, wherein the additional dielectric material comprises silicon oxide, silicon nitride, or combinations thereof.

15. The method of claim 14, wherein the silicon oxide, silicon nitride, or combinations thereof, is formed using a conformal or non-conformal deposition process.

16. The method of claim 15, wherein the additional material comprises polysilicon, and wherein the polysilicon is at least partially oxidized such that the additional cavity is sealed by silicon oxide.

17. The method of claim 1, wherein said filling at least a portion of the at least two or more cavities with a dielectric material comprises:
   overfilling the at least two or more cavities with the dielectric material; and
   removing a portion of the dielectric material above the surface of the substrate.

18. The method of claim 17, wherein said removing comprises wet chemical etching, dry etching, reactive ion etching, chemical mechanical polishing (CMP), or combinations thereof.

19. The method of claim 1, further comprising forming an additional dielectric material over the dielectric material.

20. The method of claim 19, wherein the additional dielectric material comprises silicon oxide, silicon nitride, or combinations thereof.

21. The method of claim 20, wherein the silicon oxide, silicon nitride, or combinations thereof is formed using a conformal or non-conformal deposition process.

* * * * *

UNITED STATES PATENT AND TRADEMARK OFFICE
CERTIFICATE OF CORRECTION

| | | |
|---|---|---|
| PATENT NO. | : 8,501,578 B2 | Page 1 of 1 |
| APPLICATION NO. | : 12/691917 | |
| DATED | : August 6, 2013 | |
| INVENTOR(S) | : Bishnu Prasanna Gogoi | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 682 days.

Signed and Sealed this

Thirteenth Day of January, 2015

Michelle K. Lee
*Deputy Director of the United States Patent and Trademark Office*